US007158857B2

(12) United States Patent
Schauer et al.

(10) Patent No.: US 7,158,857 B2
(45) Date of Patent: Jan. 2, 2007

(54) METHOD AND APPARATUS FOR ALIGNING A CASSETTE

(75) Inventors: Ronald Vern Schauer, Gilroy, CA (US); Alan Rick Lappen, San Martin, CA (US); David L. Tuttle, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 11/124,318

(22) Filed: May 6, 2005

(65) Prior Publication Data

US 2005/0203664 A1 Sep. 15, 2005

Related U.S. Application Data

(60) Division of application No. 10/303,516, filed on Nov. 25, 2002, now Pat. No. 6,925,356, which is a continuation of application No. 09/294,301, filed on Apr. 19, 1999, now abandoned.

(51) Int. Cl.
*G06F 7/00* (2006.01)
(52) U.S. Cl. .................... 700/218; 114/213; 414/936
(58) Field of Classification Search ................ 700/213, 700/218, 114, 121, 192, 193; 414/935–944
See application file for complete search history.

(56) References Cited

U.S. PATENT DOCUMENTS

| | | | |
|---|---|---|---|
| 3,877,134 A | 4/1975 | Shanahan | |
| 3,934,733 A | 1/1976 | Worden | |
| 4,176,751 A | 12/1979 | Gillissie | |
| 4,178,113 A | 12/1979 | Beaver, II et al. | |
| 4,493,418 A | 1/1985 | Johnson | |
| 4,687,097 A | 8/1987 | Mortensen | |
| 4,759,681 A | 7/1988 | Nogami | |
| 4,770,590 A | 9/1988 | Hughes et al. | |
| 4,819,167 A | 4/1989 | Cheng et al. | |

(Continued)

FOREIGN PATENT DOCUMENTS

EP 1047115 10/2000

(Continued)

OTHER PUBLICATIONS

Iscoff, Ron, ed. "Dry Etching Systems: Gearing Up for Larger Wafers", *Semiconductor International Magazine*, pp. 48-60, Oct. 1985.

(Continued)

*Primary Examiner*—Khoi H. Tran
(74) *Attorney, Agent, or Firm*—Konrad Raynes Victor &Mann, LLP

(57) ABSTRACT

An alignment tool, method and system are provided for aligning a cassette handler to a robot blade in a workpiece handling system, in which the tool comprises a frame or fixture adapted to be supported by the cassette handler support surface, in which the frame has one or more distance sensors positioned to measure the distance of a workpiece or robot blade from the sensor or a predetermined reference point or surface. In a preferred embodiment, the frame emulates a workpiece cassette and the distance sensors provide a numerical output of the distance to the workpiece. As explained in greater detail below, these distance measurements facilitate accurately leveling and aligning the cassette handler support surface relative to a workpiece supported by the robot blade such that when the frame is replaced by an actual workpiece cassette, the workpiece cassette will also be level and aligned with respect to the robot blade and the workpiece held by the blade. As a consequence, accidental scratching and breakage of workpieces such as semiconductor wafers and display substrates may be reduced or eliminated.

18 Claims, 22 Drawing Sheets

U.S. PATENT DOCUMENTS

| | | |
|---|---|---|
| 4,836,733 A | 6/1989 | Hertel et al. |
| 4,951,601 A | 8/1990 | Maydan et al. |
| 4,952,299 A | 8/1990 | Chrisos et al. |
| 4,955,780 A | 9/1990 | Shimane et al. |
| 5,042,671 A | 8/1991 | Bischoff et al. |
| 5,111,936 A | 5/1992 | Kos |
| 5,149,244 A | 9/1992 | Webber et al. |
| 5,186,594 A | 2/1993 | Toshima et al. |
| 5,186,718 A | 2/1993 | Tepman et al. |
| 5,217,341 A | 6/1993 | Webber et al. |
| 5,225,691 A | 7/1993 | Powers et al. ............... 414/331 |
| 5,227,708 A | 7/1993 | Lowrance |
| 5,292,393 A | 3/1994 | Maydan et al. |
| 5,387,067 A | 2/1995 | Grunes |
| 5,436,721 A | 7/1995 | Pence et al. |
| 5,438,418 A | 8/1995 | Fukui et al. |
| 5,443,346 A | 8/1995 | Murata et al. |
| 5,447,409 A | 9/1995 | Grunes et al. |
| 5,452,521 A | 9/1995 | Niewmierzycki |
| 5,454,170 A | 10/1995 | Cook |
| 5,483,138 A | 1/1996 | Shmookler et al. |
| D368,802 S | 4/1996 | Gallagher et al. |
| 5,510,892 A | 4/1996 | Mizutani et al. |
| 5,516,732 A | 5/1996 | Flegal |
| 5,525,024 A | 6/1996 | Freerks et al. |
| 5,530,550 A | 6/1996 | Nikoonahad et al. |
| 5,556,248 A | 9/1996 | Grunes |
| 5,563,798 A | 10/1996 | Berken et al. |
| 5,570,994 A | 11/1996 | Somekh et al. |
| 5,604,443 A | 2/1997 | Kitamura et al. |
| 5,605,428 A * | 2/1997 | Birkner et al. .......... 414/331.15 |
| 5,610,102 A | 3/1997 | Gardopee et al. |
| 5,611,655 A | 3/1997 | Fukasawa et al. |
| 5,615,988 A | 4/1997 | Wiesler et al. |
| 5,644,400 A | 7/1997 | Mundt |
| 5,655,277 A | 8/1997 | Galdos et al. |
| 5,706,201 A | 1/1998 | Andrews |
| 5,713,711 A | 2/1998 | McKenna et al. |
| 5,740,059 A | 4/1998 | Hirata et al. |
| 5,769,588 A | 6/1998 | Toshima et al. |
| 5,783,834 A | 7/1998 | Shatas .................... 250/559.3 |
| 5,785,186 A | 7/1998 | Babbs et al. |
| 5,980,188 A | 11/1999 | Ko et al. .................... 414/417 |
| 5,980,194 A | 11/1999 | Freerks et al. |
| 6,010,009 A | 1/2000 | Peterson et al. |
| 6,036,031 A | 3/2000 | Ishikawa |
| 6,039,186 A | 3/2000 | Bhatt et al. |
| 6,047,480 A | 4/2000 | Powers |
| 6,060,721 A | 5/2000 | Huang .................... 250/559.4 |
| 6,063,196 A | 5/2000 | Li et al. .................... 118/712 |
| 6,082,950 A | 7/2000 | Altwood et al. |
| 6,085,125 A | 7/2000 | Genov ........................ 700/218 |
| 6,095,335 A | 8/2000 | Busby |
| 6,126,380 A | 10/2000 | Hillman |
| 6,178,361 B1 | 1/2001 | George et al. .............. 700/213 |
| 6,197,117 B1 | 3/2001 | Li et al. |
| 6,219,313 B1 * | 4/2001 | Ries et al. ................ 369/30.31 |
| 6,298,280 B1 | 10/2001 | Bonora et al. |
| 6,300,644 B1 | 10/2001 | Beckhart et al. |
| 6,307,211 B1 | 10/2001 | Beckhart et al. |
| 6,388,436 B1 * | 5/2002 | Nodot et al. .............. 324/158.1 |
| 6,401,554 B1 | 6/2002 | Mori et al. |
| 6,403,945 B1 * | 6/2002 | Roessler et al. ............. 250/221 |
| 6,419,439 B1 * | 7/2002 | Schlehahn et al. ...... 414/331.18 |
| 6,542,839 B1 * | 4/2003 | Lu et al. ........................ 702/94 |
| 6,763,281 B1 * | 7/2004 | Schauer et al. ............. 700/218 |
| 6,925,356 B1 * | 8/2005 | Schauer et al. ............. 700/213 |
| 2003/0060922 A1 | 3/2003 | Schauer et al. |

FOREIGN PATENT DOCUMENTS

| | | |
|---|---|---|
| JP | 1028933 | 1/1989 |
| JP | 4156624 | 5/1992 |
| JP | 5013551 | 1/1993 |
| JP | 7071929 | 3/1995 |
| JP | 7071929 | 7/1995 |
| JP | 9162257 | 6/1997 |
| JP | 9199571 | 7/1997 |
| JP | 10154738 | 6/1998 |
| WO | 9858402 | 12/1998 |

OTHER PUBLICATIONS

AMAT Manual 042-021-03, Chapter 3, "Wafer Handler," pp. 3-33 to 3-42.
AMAT Manual 042-021-03, Chapter 3, "Wafer Handler," pp. 3-42 to 3-54.
AMAT Manual 042-021-03, Chapter 3, "Wafer Handler," pp. 3-54 to 3-73.
AMAT Manual 142-351-02, Chapter 7, "Wafer Handler Setup and Calibration," pp. 7-1 to 7-18.
AMAT Manual 142-351-02, Chapter 7, "Wafer Handler Setup and Calibration," pp. 7-19 to 7-26.
AMAT Manual 256-024-03, Chapter 7, "Wafer Handler and Wafer Handoff Setup and Calibrations," pp. 7-1 to 7-17.
U.S. Appl. No. 60/113,020, filed Dec. 21, 1998.
U.S. Appl. No. 60/127,895, filed Apr. 5, 1999.
EP 00303255.4 Search Report dated Apr. 28, 2003.
Declaration of Alan Rick Lappen dated Jul. 13, 2001.
Declaration of Ronald V. Schauer dated Nov. 18, 2002.
Declaration of Ronald V. Schauer dated Nov. 18, 2002.
Declaration of F. Eric Ruhland dated Dec. 2, 2002.
U.S. Appl. No. 10/266,389, filed Oct. 8, 2002, entitled "Cassette Alignment Tool,".
Beckhart et al., U.S. Appl. No. 60/113,020, filed Dec. 21, 1998, USPTO file history, 16 pp.
Beckhart et al., U.S. Appl. No. 60/127,895, filed Apr. 5, 1999, USPTO file history, 17 pp.

* cited by examiner

IST SAMPLE

| | | |
|---|---|---|
| BLUE | 0.000 in | △L/R 0.000 in |
| YELLOW | 0.000 in | △F/B 0.000 in |
| RED | 0.000 in | |
| ZERO | | |

— 530

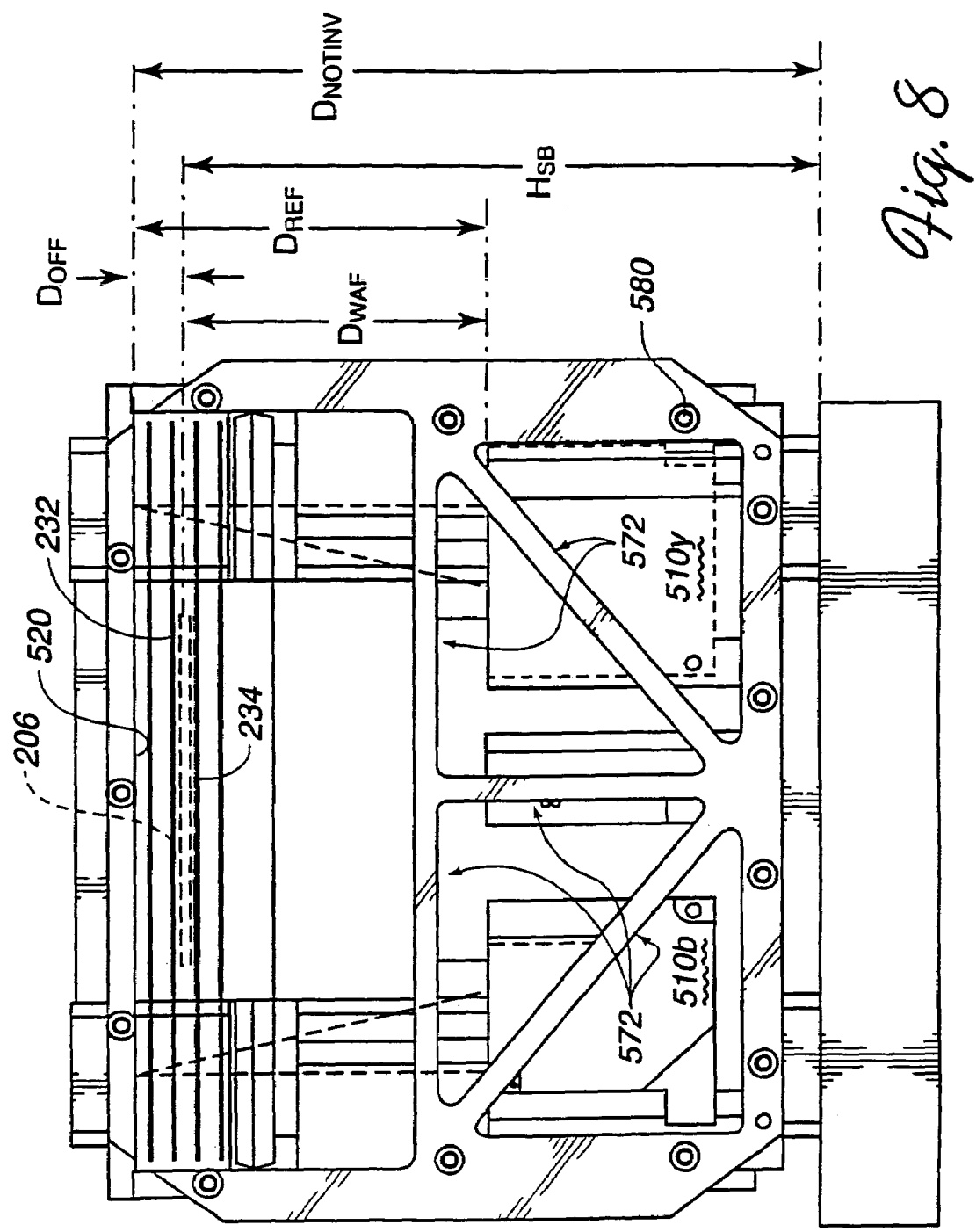

```
BLUE      1.333 in        ΔL/R 0.000 in
YELLOW    1.333 in        ΔF/B 0.000 in
RED       1.333 in
ZERO
```
— 530
*Fig. 11*
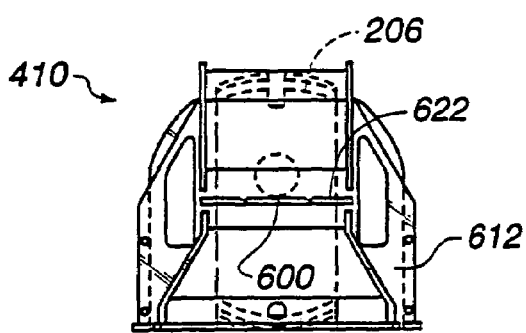
*Fig. 12a*
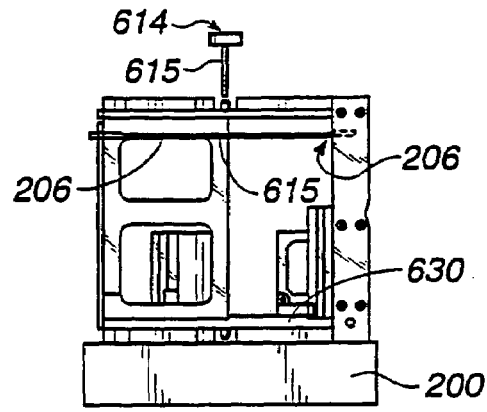
*Fig. 12b*
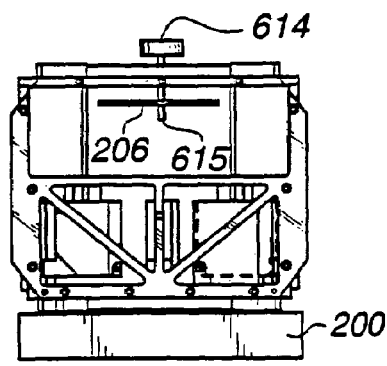
*Fig. 12c*
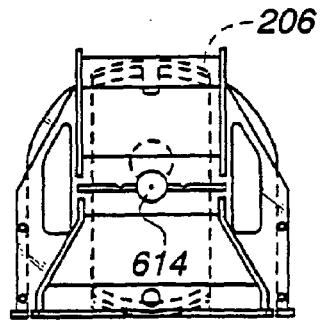
*Fig. 12d*

HANDLER LEADSCREW CALIBRATION
Work Sheet

1702 — Slot base #24 Current Step Count: __123456__

Slot base #24 Laser Readings:
Red Laser: __1.333__
Yellow Laser: __1.333__
Blue Laser: __1.333__
Total: __3.999__

$\phantom{3/}$ __1.333__
$3/\overline{3.999}$

Average Reading Slot base #24 __1.333__ — 1704

CAT Height-top plate  $D_{NOTINV}$  _____  1705
Average SB #24  __-1.333__
SB #24 Final Height  $H_{SB24}$  _____

Average reading

---

1732 — Slot base #2 Current Step Count: __603155__

Slot base #2 Laser Readings:
Red Laser: __1.300__
Yellow Laser: __1.300__
Blue Laser: __1.300__
Total: __3.900__

$\phantom{3/}$ __1.300__
$3/\overline{3.900}$

Average Reading Slot base #2 __1.300__ — 1736

Top Plate Thickness  $D_{INV}$  _____  1735
Average SB #2  __1.300__
SB #2 Final Height  $H_{SB2}$  _____

Average reading

---

1752

S B #24 Height: $H_{SB24}$
S B #2 Height: $-H_{SB2}$
Final SB Height: $H_{SBF}$   1754
Wafer Thickness: $+$ __.0290__
Final Height: SB #2 & SB #24  $H_F$

1750 Slot Base #24 Current Step count: __123456__
Slot Base #2 Current Step count: __- 603155__
Final number of steps from #24 to #2: __- 479699__

---

$H_F$ /__479699__
Final height: SB #2 & SB #24

P _____ Final number of steps Per inch:
Final number of steps from #24 to #2

1756

P _____ Final number of steps Per inch
X __.250__ Slot Spacing Per .XXX inch:
S _____ Final number of Steps from Slot to Slot

*Fig. 18*

METHOD AND APPARATUS FOR ALIGNING A CASSETTE

This application is a division of U.S. application Ser. No. 10/303,516, filed Nov. 25, 2002 now U.S. Pat. No. 6,925,356, which is incorporated herein by reference in its entirety and which is a continuation of U.S. application Ser. No. 09/294,301 filed Apr. 19, 1999, which is incorporated herein by reference in its entirety and which is now abandoned.

FIELD OF THE INVENTION

The present invention relates to automated workpiece handling systems, and more particularly, to methods and devices for aligning a cassette for workpieces in an automated workpiece handling system.

BACKGROUND OF THE INVENTION

In order to decrease contamination and to enhance throughput, semiconductor processing systems often utilize one or more robots to transfer semiconductor wafers, substrates and other workpieces between a number of different vacuum chambers which perform a variety of tasks. An article entitled "Dry Etching Systems: Gearing Up for Larger Wafers", in the October, 1985 issue of Semiconductor International magazine, pages 48–60, describes a four-chamber dry etching system in which a robot housed in a pentagonal-shaped mainframe serves four plasma etching chambers and a loadlock chamber mounted on the robot housing. In order to increase throughput, it has been proposed to utilize two loadlock chambers as described in U.S. Pat. No. 5,186,718. In such a two loadlock system, both loadlock chambers are loaded with full cassettes of unprocessed wafers. FIG. 1 of the present application illustrates two typical loadlock chambers LLA and LLB, each having a cassette 190 therein for holding unprocessed wafers 192 to be unloaded by a robot 194 and transferred to various processing chambers 196 attached to a mainframe 198.

The loadlock chamber LLA, for example, is a pressure-tight enclosure which is coupled to the periphery of the mainframe 198 by interlocking seals which permit the loadlock chamber to be removed and reattached to the mainframe as needed. The cassette 190 is loaded into the loadlock chamber LLA through a rear door which is closed in a pressure-tight seal. The wafers are transferred between the mainframe 198 and the loadlock chamber LLA through a passageway 199 which may be closed by a slit valve to isolate the loadlock chamber volume from the mainframe volume.

As shown in FIG. 2, a typical cassette 190 is supported by a platform 200 of a cassette handler system 208 which includes an elevator 210 which elevates the platform 200 and the cassette 190. The platform 200 has a top surface which defines a base plane 220 on which the cassette 190 rests. As the cassette includes a plurality of "slots" 204 or wafer support locations, the elevator moves the cassette to sequentially position each of the slots with the slit valves to allow a robot blade to pass from the mainframe, through the slit valve, and to a location to "pick" or deposit a wafer in a wafer slot.

The slots 204 of the cassette may be initially loaded with as many as 25 or more unprocessed wafers or other workpieces before the cassette is loaded into the loadlock chamber LLA. After the loadlock access door is closed and sealed, the loadlock chamber is then pumped by a pump system down to the vacuum level of the mainframe 198 before the slit valve is opened. The robot 194 which is mounted in the mainframe 198 then unloads the wafers from the cassette one at a time, transferring each wafer in turn to the first processing chamber. The robot 194 includes a robot hand or blade 206 which is moved underneath the wafer to be unloaded. The robot 194 then "lifts" the wafer from the wafer slot supports supporting the wafers in the cassette 190. By "lifting," it is meant that either the robot blade 206 is elevated or the cassette 190 is lowered by the handler mechanism 208 such that the wafer is lifted off the cassette wafer supports. The wafer may then be withdrawn from the cassette 190 through the passageway and transferred to the first processing chamber.

Once a wafer has completed its processing in the first processing chamber, that wafer is transferred to the next processing chamber (or back to a cassette) and the robot 194 unloads another wafer from the cassette 190 and transfers it to the first processing chamber. When a wafer has completed all the processing steps of the wafer processing system, and two cassettes full of wafers are loaded in the loadlocks, the robot 194 returns the processed wafer back to the cassette 190 from which it came. Once all the wafers have been processed and returned to the cassette 190, the cassette in the loadlock chamber is removed and another full cassette of unprocessed wafers is reloaded. Alternatively, a loaded cassette may be placed in one loadlock, and an empty one in the other loadlock. Wafers are thus moved from the full cassette, processed, and then loaded into the (initially) empty cassette in the other loadlock. Once the initially empty cassette is full, the initially full cassette will be empty. The full "processed" cassette is exchanged for a full cassette of unprocessed wafers, and these are then picked from the cassette, processed, and returned to the other cassette. The movements of the robot 194 and the cassette handler 208 are controlled by an operator system controller 222 (FIG. 1) which is often implemented with a programmed workstation.

As shown in FIGS. 2 and 3, the wafers are typically very closely spaced in many wafer cassettes. For example, the spacing between the upper surface of a wafer carried on a moving blade and the lower surface of an adjacent wafer in the cassette may be as small as 0.050 inches. Thus, the wafer blade must be very thin, to fit between wafers as cassettes are loaded or unloaded. As a consequence, it is often important in many processing systems for the cassette and the cassette handler 208 to be precisely aligned with respect to the robot blade and wafer to avoid accidental contact between either the robot blade or the wafer carried by the blade and the walls of the cassette or with other wafers held within the cassette.

However, typical prior methods for aligning the handler and cassette to the robot blade have generally been relatively imprecise, often relying upon subjective visual inspections of the clearances between the various surfaces. Some tools have been developed to assist the operator in making the necessary alignments. These tools have included special wafers, bars or reference "pucks" which are placed upon the robot blade and are then carefully moved into special slotted or pocketed receptacles which are positioned to represent the tolerance limits for the blade motions. However, many of these tools have a number of drawbacks. For example, some tools rely upon contact between the blade or a tool on the blade and the receptacle to indicate a condition of nonalignment. Such contact can be very detrimental to high precision mechanisms for moving the blade as well as the blade itself.

Also, many such tools do not indicate the degree of alignment or nonalignment but merely a "go/no-go" indication of whether contact is likely.

In aligning the handler mechanism to the robot blade, one procedure attempts to orient the cassette to be as level as possible with respect to the robot blade. One tool that has been developed to assist in the leveling procedure has dual bubble levels in which one bubble level is placed on the blade and the other is placed on the cassette. The operator then attempts to match the level orientation of the blade to that of the cassette. In addition to being very subjective, such bubble tools have also often been difficult to see in the close confines of the cassette and handler mechanisms.

As a consequence of these and other deficiencies of the prior alignment procedures and tools, alignments have often tended to be not only imprecise but also inconsistent from application to application. These problems have frequently lead to the breakage or scratching of very expensive wafers and equipment as well as the generation of damaging particulates in the systems.

SUMMARY OF THE INVENTIONS

The present inventions are, in one aspect, directed to an alignment tool, method and system for aligning a cassette handler to a robot blade in a workpiece handling system, in which the tool comprises a frame or fixture adapted to be supported by the cassette handler support surface, in which the frame has one or more distance sensors positioned to measure the distance of a workpiece or robot blade from the sensor or a predetermined reference point or surface. In a preferred embodiment, the frame emulates a workpiece cassette and the distance sensors provide a numerical output of the distance to the workpiece. As explained in greater detail below, these distance measurements facilitate accurately leveling the cassette handler support surface relative to a workpiece supported by the robot blade such that when the frame is replaced by an actual workpiece cassette, the workpiece cassette will also be level with respect to the robot blade and the workpiece held by the blade. As a consequence, accidental scratching and breakage of workpieces such as semiconductor wafers and display substrates may be reduced or eliminated.

In another aspect of the present inventions, the output of the distance sensor or sensors may be used to determine the height of the workpiece held by the blade relative to a predetermined reference point or surface. This reference point is related to the actual measurements of a production wafer cassette. As a result, the workpiece cassette elevator of the cassette handler system may be set to accurately position the robot blade and workpiece at preferred heights for various handler operations such as the slot base and slot delta positions (which are a function of the space or distance between adjacent slots in a given cassette) of the workpiece cassette being emulated, for example.

In yet another aspect of the present inventions, the distance sensors may be used to map the path of a workpiece as it is moved in or out of the frame. The data collected may then be displayed in a graphical or other format to represent the path of the workpiece and robot blade through a volume of space. This volume may be compared to a preferred volume of space (e.g., the envelope of a production wafer cassette) and the path of the blade and workpiece, and adjusted to ensure that the path remains within the preferred volume of space.

In still another aspect of the present inventions, the frame has a predetermined reference surface positioned opposite the distance sensors of the frame. In a preferred embodiment, the frame reference surface is accurately positioned by the frame to be at a predetermined orientation and distance from a cassette handler reference point or surface such as the cassette handler support surface. As a consequence, as explained in greater detail below, distance measurements to the workpiece or robot blade may be output as offsets from this predetermined frame reference surface which significantly facilitates calibrating the distance sensors.

In a further aspect of the present inventions, the frame has an alignment surface which may be aligned with a corresponding alignment surface on the robot blade to align the robot blade to the frame emulating the workpiece cassette. In a preferred embodiment, the frame and the robot blade each have an alignment aperture which receives an alignment pin when the frame and robot blade are aligned in a selected operational orientation such as a wafer pickup position. Robot control variables such as blade rotation and extension step counts may then be set to define a blade position at the desired aligned position.

In still another aspect of the present inventions, the frame has a plurality of sets of registration surfaces which are each adapted to register the frame to the cassette handler support surface. As a consequence, the frame may be seated in the cassette handler in a plurality of orientations. As explained below, such an arrangement facilitates performing alignment and height setting operations at widely spaced blade height positions to increase the accuracy of those procedures.

In yet another aspect of the present inventions, a preferred embodiment includes a computer operated graphical user interface which can significantly facilitate rapid and accurate performance of alignment and setting procedures utilizing the alignment frame of the present inventions. As set forth below, the computer assisted embodiments can perform various calculations including preferred blade height positions such as the slot base and slot delta positions and elevator characterizations for example. Actual measurements may be compared to preferred values calculated or otherwise provided and appropriate adjustments made.

BRIEF DESCRIPTION OF THE DRAWINGS

Embodiments of the invention are described with reference to the accompanying drawings which, for illustrative purposes, are schematic and not drawn to scale.

FIG. 3A is an enlarged partial view of the wafer cassette of FIG. 3, depicting a wafer resting in a slot and a wafer picked up from a slot.

FIG. 8 is a front view of the metrology cassette of FIG. 4.

FIG. 11 is a schematic view of the display of the interface controller of the system of FIG. 4, during a wafer height measurement procedure.

FIG. 12a is a top view of the metrology cassette of FIG. 4 illustrating an extension and rotation alignment procedure.

FIG. 12b is a side view of the metrology cassette of FIG. 4 illustrating an extension and rotation alignment procedure.

FIG. 12c is a front view of the metrology cassette of FIG. 4 illustrating insertion of an alignment pin during an extension and rotation alignment procedure.

FIG. 12d is a top view of the metrology cassette of FIG. 4 illustrating insertion of an alignment pin during an extension and rotation alignment procedure.

FIG. 18 depicts a manual worksheet used in a leadscrew characterization procedure.

DETAILED DESCRIPTION

Figure 4:
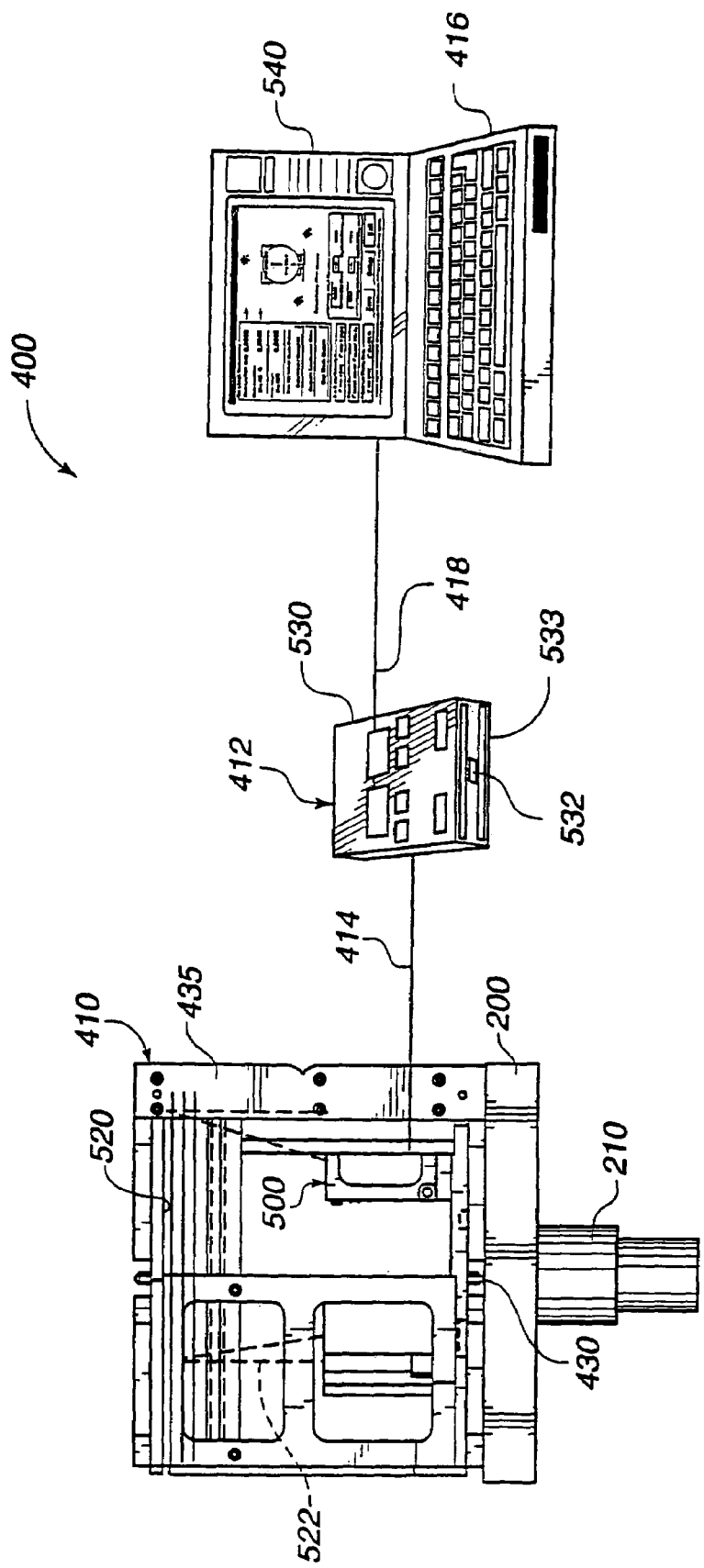
FIG. 4 is a schematic pictorial view of a cassette alignment tool system in accordance with a preferred embodiment of the present invention.

A cassette alignment tool system in accordance with a preferred embodiment of the present invention is indicated generally at 400 in FIG. 4. The cassette alignment tool 400 comprises a metrology cassette 410, cassette controller 412 coupled by a communication cable 414 to the metrology cassette 410, and a computer 416 coupled by a communication cable 418 to the cassette controller 412. The metrology cassette 410 is secured to the cassette handler platform 200 in the same manner as an actual wafer cassette such as the cassette 190 of FIG. 2 and thus emulates the wafer cassette 190. For example, the metrology cassette has alignment and registration surfaces including an H-bar 430 and side rails 570 which are received by the cassette handler to align the cassette with respect to the handler. In addition, the metrology cassette 410 approximates the size and weight of a production wafer cassette full of wafers.

The cassette alignment tool system 400 may be used with processing systems having one or many processing chambers and one or more workpiece handling systems for transferring workpieces from one or more cassettes in one or more loadlock chambers to one or more of the processing chambers. Once a particular handling system has been properly aligned and calibrated to the robot blade and workpiece, the metrology cassette 410 may be removed from the handler and processing of workpieces may begin using a standard workpiece cassette which was emulated by the metrology cassette 410. However, it is preferred that all handlers of a particular processing system be properly aligned prior to initiating processing of production workpieces.

In accordance with one aspect of the illustrated embodiments, the metrology cassette 410 has a distance measurement device 500 which can provide precise measurements of the position of a wafer or other workpiece being held by the robot blade within the metrology cassette 410. As explained in greater detail below, these wafer position measurements can be used to accurately align an actual wafer cassette such as the cassette 190 to the robot blade in such a manner as to reduce or eliminate accidental contact between the blade or the wafer held by the blade and the cassette or wafers held within the wafer cassette.

Figure 5:
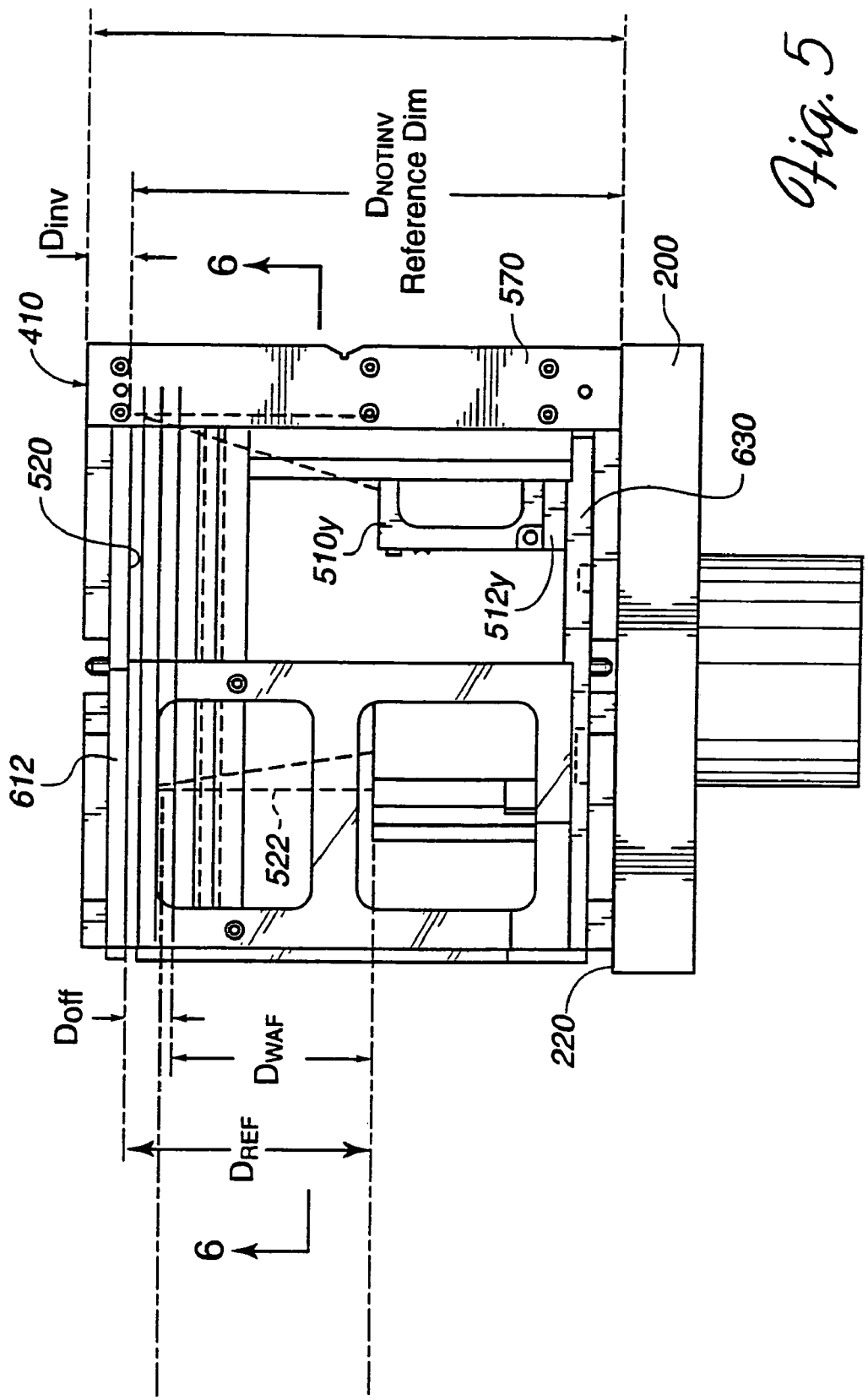
FIG. 5 is a side view of the metrology cassette of FIG. 4.

As best seen in FIGS. 5 and 6, in the illustrated embodiment, the distance measurement device 500 of the illustrated embodiment includes three laser sensors A, B and C, each of which includes a laser head 510b, 510r or 510y, which is clamped in a mounting 512b, 512r or 512y, respectively, carried by the metrology cassette 410. The mountings 512b, 512r and 512y are preferably color coded and mechanically keyed to reduce or eliminate inadvertent exchanges or misplacements of the laser heads in the mountings. Thus, the mountings 512b, 512r and 512y may be color coded blue, red and yellow, respectively, for example.

In the illustrated embodiment, the distance sensors are laser sensors manufactured by NaiS/Matsushita/Panasonic (Japan), model ANR12821 (high power) or ANR11821 (low power). This particular laser sensor operates based upon perpendicular beam, scattered reflection triangulation using a position sensing diode array. The light source (laser) impinges upon the target perpendicular to the surface of the target, preferably within a relatively small angle. The surface preferably provides a diffuse reflection that is visible to the sensing device over a relatively wide angle. The field of view of the sensing device is focused upon a linear optical sensor, the output of which is interpreted to determine the displacement of the target surface within the field of view. The geometry of the light path therefore forms a right triangle with light from the light source traveling along the vertical edge and reflected light of the return path traveling along the diagonal. The distance between the sensor and the target may then be calculated using the Pythagorean theorem.

Although the distance sensors are described in the illustrated embodiments as three laser sensors, it is appreciated that other types and numbers of distance measuring sensors may be used. For example, there are several different techniques and methods utilized by commercial laser distance sensors. These include scattered light triangulation, reflective triangulation, perpendicular and angled beam triangulation, time delta, interference pattern deciphering, CCD array sensors, position sensing diode sensors, position sensing photoresistor sensors, etc. It is anticipated that a variety of non-laser and non-light based distance measuring sensors may be suitable as well.

Figure 6A:
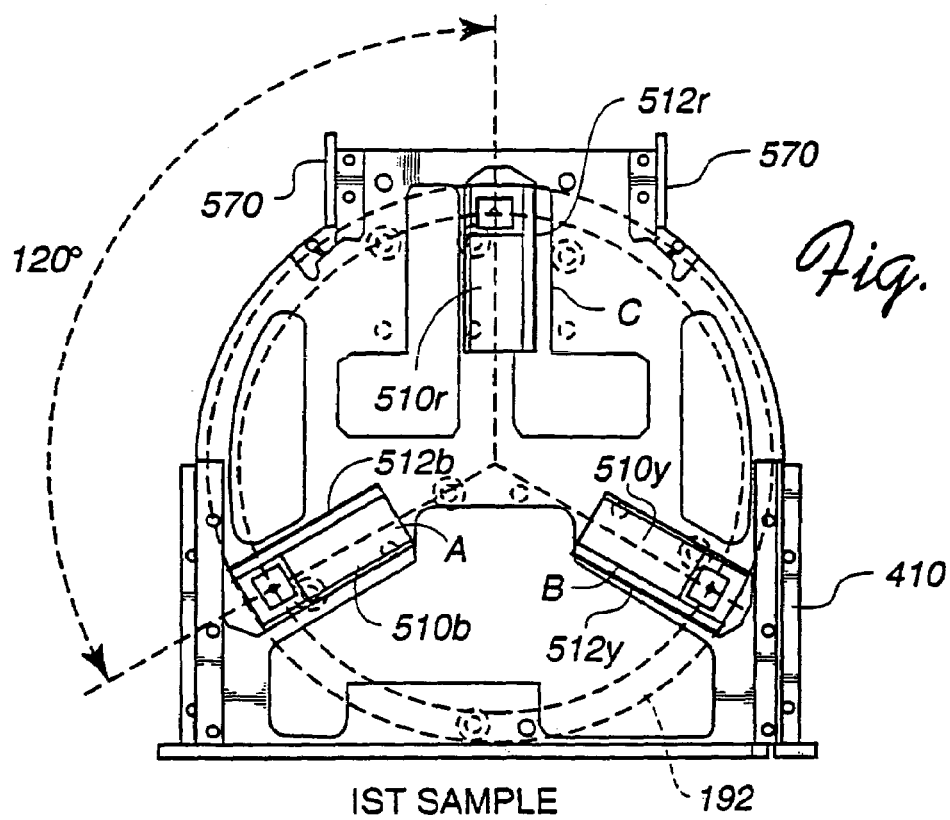
FIGS. 6A, 6B and 6C are a schematic partial cross-sectional top views of the metrology cassette of FIG. 5, showing distance sensors in various configurations.
Figure 6B:
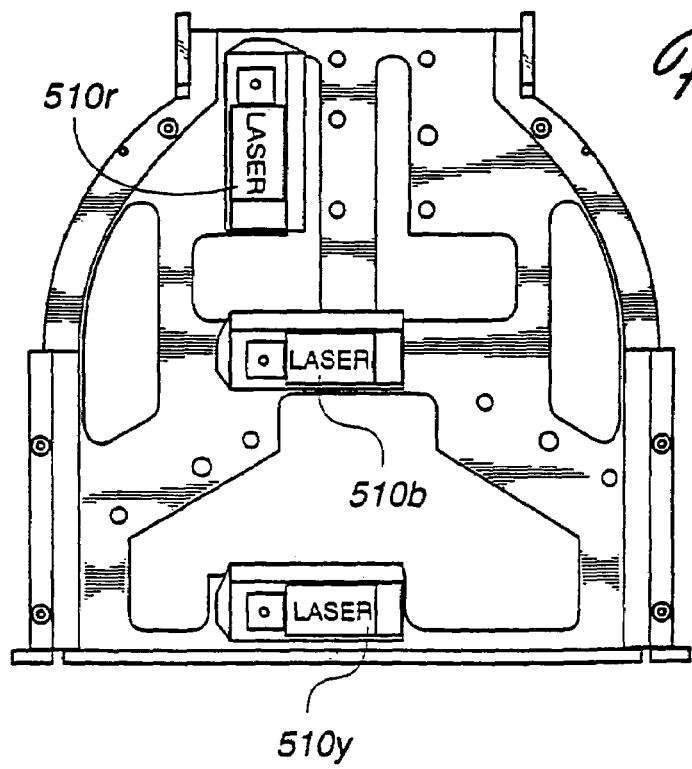

In the embodiment of FIG. 6A, the heads 510*b*, 510*r* and 510*y* of the laser sensors are positioned in an equilateral triangular placement which facilitates a three point plane distance determination for measuring the height of a surface such as a wafer surface. As explained in greater detail below, the laser heads may be readily repositioned to other placements including an in-line placement for blade motion mapping (FIG. 6B), and a modified right triangle placement (FIG. 6C) for on-blade measurements.

Sensor Calibration

In another aspect of the illustrated embodiments, the metrology cassette 410 includes a precision internal reference surface 520 (FIG. 5) which provides a fixed reference point from which all measurements may be gauged. It is fixed at the top of the cassette whereas the laser sensors are fixed to the bottom. The laser sensor light beams 522 are intercepted by the reference surface 520 when no wafer is present inside the metrology cassette 410 and are reflected by the surface 520 back to the laser heads of the laser sensor.

In the illustrated embodiment, the metrology cassette 410 is manufactured so that the reference surface 520 is relatively flat and parallel with respect to the base plane 220 of the platform 200 of the cassette handler to a relatively high degree of precision. All subsequent distance measurements of the wafer can be made as offsets to this reference surface 520. Because of the effects of temperature and aging of electronics, the output of the laser sensors can often vary over time. Thus, the actual value of the laser measurements of the distance $D_{REF}$ between the laser sensors and the reference surface 520 can also vary over time even though the actual distance remains fixed. However, because all subsequent distance measurements of the wafer are made as offsets to this reference surface 520 whatever value the lasers determine the distance $D_{REF}$ between the laser sensors and the reference surface 520 to be, that value is considered to be the "zero" distance. Any subsequent measurement of wafer position is calculated as the difference or offset $D_{OFF}$ between the measured reference distance $D_{REF}$ and the measured wafer distance $D_{WAF}$. Hence, calibrating the laser sensors is simply a matter of turning the laser sensors on and after a sufficient warm up time, noting the measured reference distance $D_{REF}$ and assigning that value as the "zero" distance.

For example, in the illustrated embodiment, once the cassette alignment tool system 400 has powered up properly the operator will see three (3) red laser light spots on the reference surface 520. For some laser sensors it may take up to five seconds for the laser spots to appear. As the laser heads warm up, the distance values displayed for each laser head by the interface controller display 530 (FIG. 7) may fluctuate. To ensure adequate warm up time for the displayed values to stabilize, the interface controller 412 may include a built-in timer which displays a warm-up timing bar at the bottom of a display 530 which may be an LCD display for example. Other types of displays may be used including the display 540 of the computer 416 which may display a graphical user interface (GUI). The warm-up timing bar on the bottom line of the display 530 may be programmed to disappear when the laser heads have warmed up (typically in about five (5) minutes).

When the warm-up is complete the bottom line will display "*WARMUP COMPLETED*." At this time, the interface controller display 530 will display the raw distance values next to "blue," "yellow," and "red" labels for each laser's output. As explained in greater detail below, the outputs of the metrology cassette 410 laser sensors are sampled and averaged over a period of time sufficient to substantially cancel out noise and vibration effects.

Figures 6C, 7:
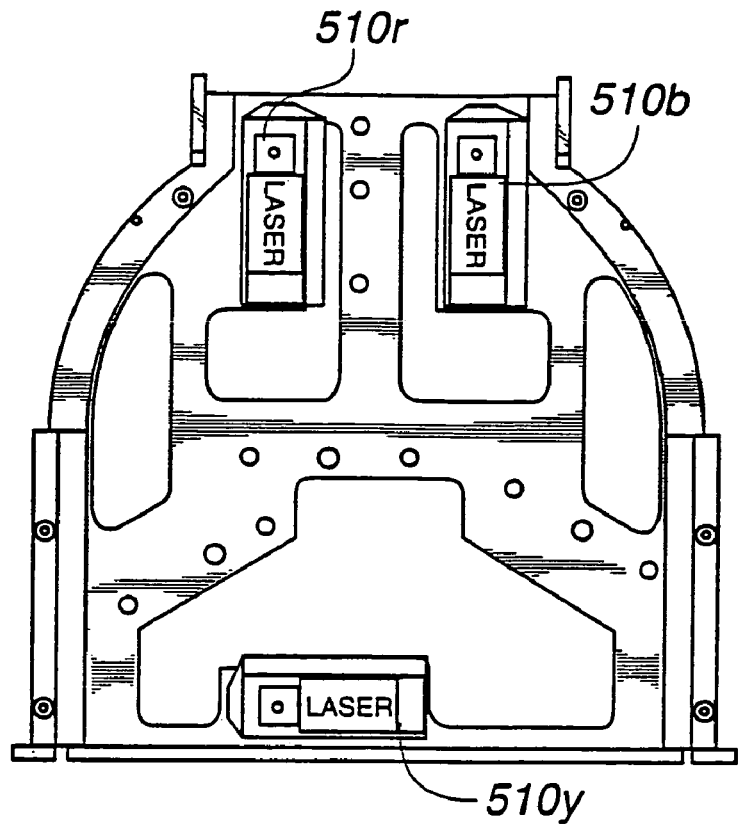
FIG. 7 is a schematic view of display of the interface controller of the system of FIG. 4.

The operator may now "zero", or calibrate the cassette alignment tool system 400 by pressing a button 532 on the interface controller 412, which is labeled "ZERO." In response, the system assigns the three distance values measured by the three laser heads to be the distance $D_{REF}$ between that laser sensor and the reference surface 520 for each laser head. In that this distance value for each laser is the "zero" distance, the displayed measurement values for each laser head, labeled "blue," "yellow," and "red," are set to indicate 0.000 as shown in FIG. 7. Calibration of the laser sensors is thus completed in a simple manner without requiring any external instruments or tools.

Figure 7A:
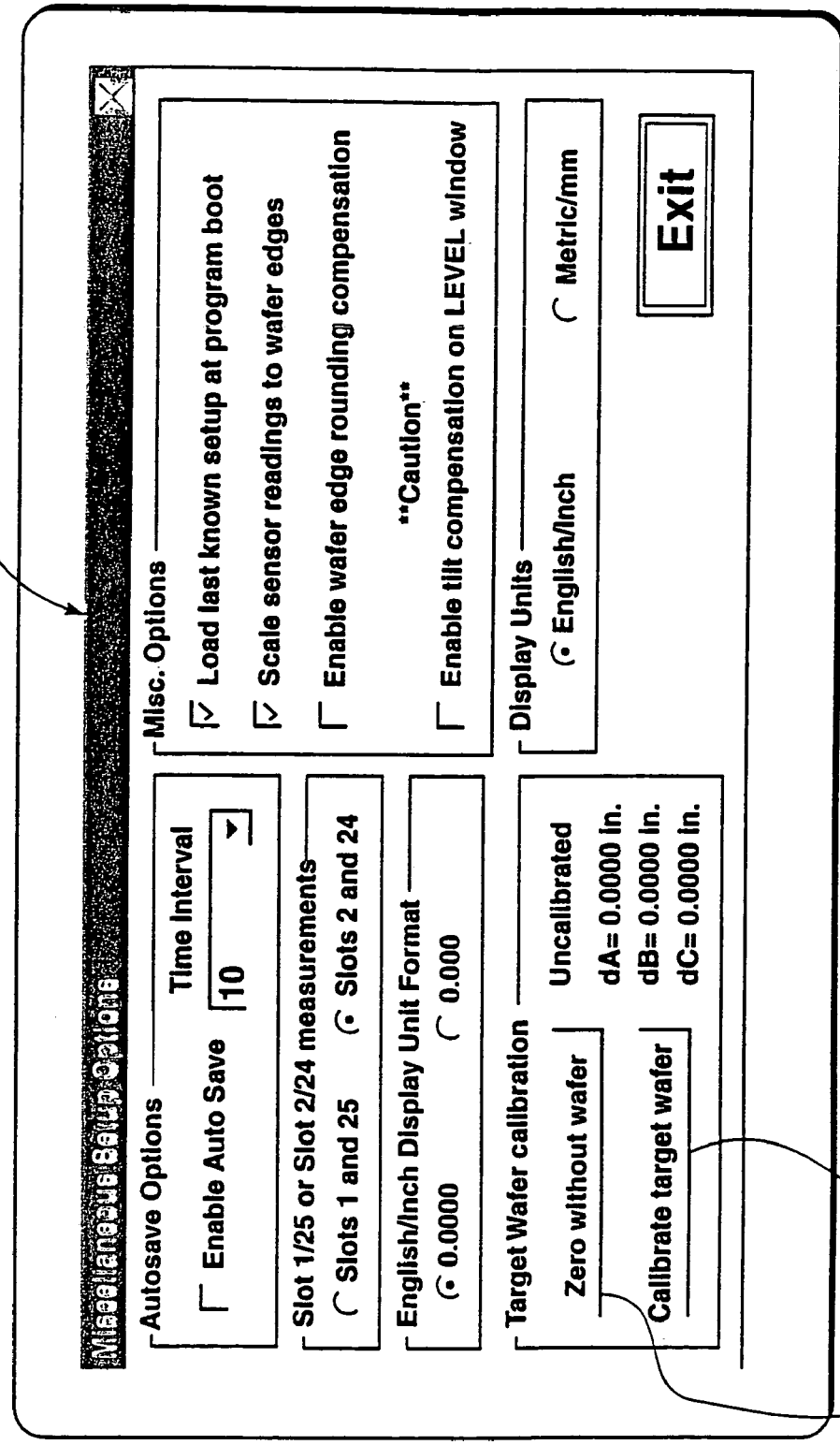
FIG. 7A is a view of the computer display of FIG. 4, depicting an input-output screen used in a calibration procedure.

FIG. 7A shows an example of an input-output screen 700 of a graphical user interface of the display 540 of the computer 416 that may also be used to calibrate the distance sensors. The screen 700 has a "button" 702 labeled "zero without wafer" which may be activated by the operator moving the display cursor over the button 702 and depressing the appropriate mouse or other input device button. Again, in response, the system assigns the three distance values measured by the three laser heads to be the distance $D_{REF}$ between that laser sensor and the reference surface 520 for each laser head. The three distance values dA, dB and dC for the three laser heads A, B and C, respectively, are each assigned an output value of 0.0000 inches as shown in the screen of FIG. 7A.

Although the reference surface 520 of the metrology cassette 410 of the illustrated embodiment is described as being flat and parallel, it is appreciated that other shapes and orientations of reference surfaces and points may be used, depending upon the application. Also, the computer 416 is illustrated as a standard "laptop" size computer. A variety of computing devices may be used including workstations and dedicated processors. The computer 416 preferably has memory including short term and mass storage memory as well as processors and input-output devices including keyboards, printers, display screens and mouse or other pointing devices. The computer 416 is preferably programmed to facilitate the implementation of the procedures discussed herein.

Workpiece Target Surface Calibration

In accordance with another aspect of the present embodiments, it is recognized that targets being sensed by distance sensors may respond to the distance sensors in different manners. For example, in the illustrated embodiment, laser sensors are used to measure the distance from the sensor to the reference surface 520 and also to measure the distance to a workpiece, which is a silicon wafer in the illustrated embodiment. These sensors operate on the principle of the target having a surface which reflects a light wave emitted by the sensor, back to the sensor. The sensors of the illustrated embodiment emit laser beams in the red visible range. However, a small portion of the emission is in the near-infrared range, and silicon wafers have a degree of transparency to infrared radiation. As a consequence, the infrared portion of the radiation from the laser sensors is typically not reflected by the outermost exterior surface of the silicon wafer but is usually reflected at an internal depth within the silicon wafer. By comparison, the reference surface 520 of the illustrated embodiment has a treated surface which preferably reflects the sensor beam more closely from the actual exterior of the reference surface.

Because the reference surface and the workpiece may respond differently to the sensor beams from the sensors, an error or deviation may be introduced into the measurements of the true distances. The responsiveness of the target surface of the workpiece and the target surface of the reference surface 520 may be measured and compared to determine any such difference which may be expressed as a correction factor. This correction factor may then be applied to distance measurements of the target workpiece to compensate for the manner in which the target workpiece responds to the sensor beams and thereby reduce or eliminate any such error caused by such differences.

To determine the correction factor, the distance sensors are first calibrated in the manner discussed above with no wafer present in the metrology cassette. Thus, the "button" 702 labeled "zero without wafer" of the screen 700 may be activated by the operator moving the display cursor over the button 702 and depressing the appropriate mouse or other input device button. Accordingly, the laser beams emitted by the laser sensors and reflected by the reference surface 520 are sensed to provide the reference distances $D_{REF}$ to the reference surface for each laser head.

Figure 16:
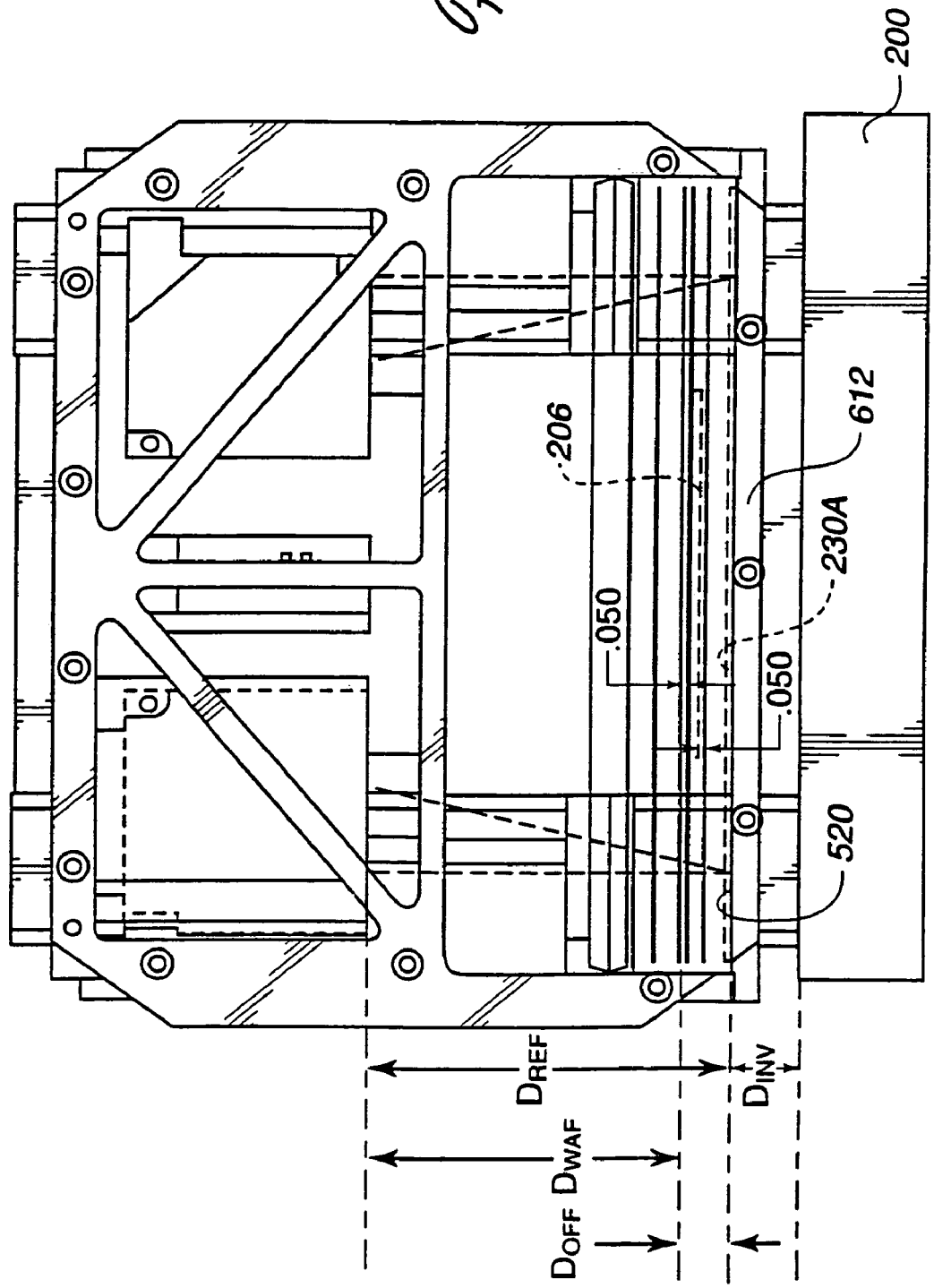
FIG. 16 is a front view of the metrology cassette of FIG. 4, showing the metrology cassette in an inverted position.
Figure 16A:
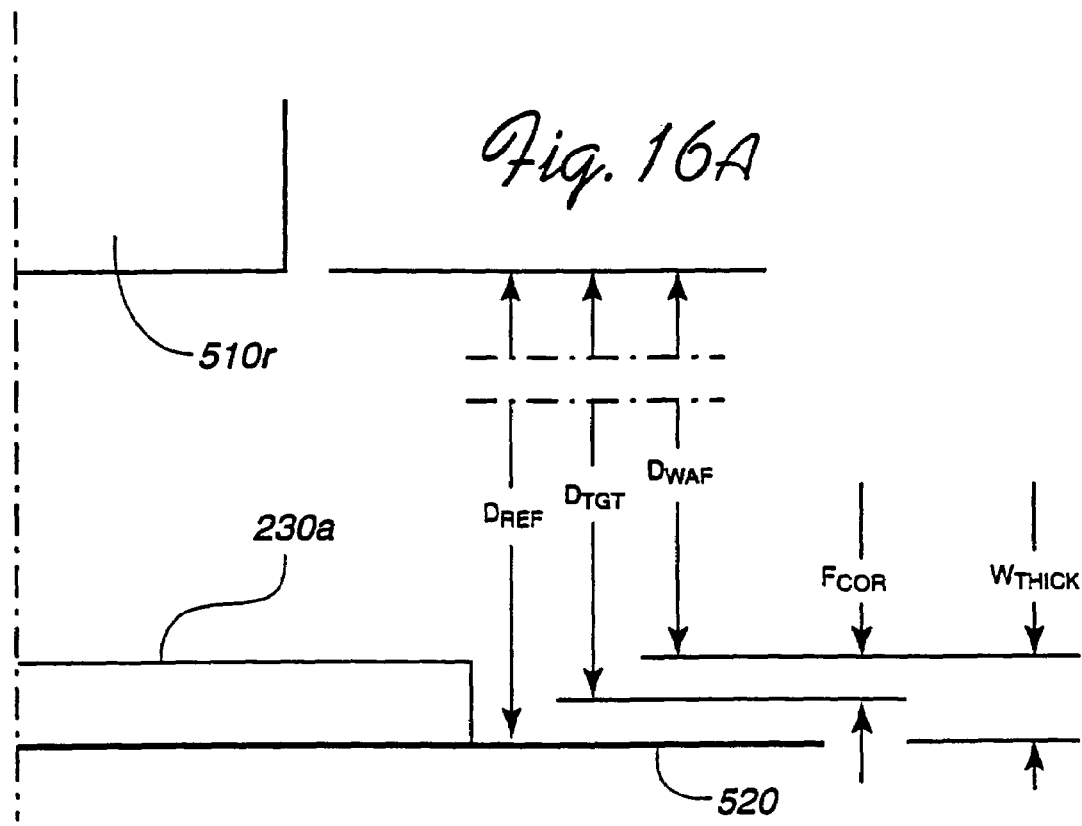
FIG. 16a is a partial schematic view of a wafer resting on the reference surface of the metrology cassette in an inverted position.

The metrology cassette 410 may then be inverted and placed on a suitable supporting surface. In this position, a wafer 230a may be conveniently positioned on and supported by the metrology cassette reference surface 520. In this position, the laser sensing beams are reflected by the wafer 230a rather than the reference surface 520. If the laser beams are reflected by the exterior surface of the wafer, the distance measurement $D_{TGT}$ to the target would change by the thickness $W_{THICK}$ of the wafer. However, because silicon wafers have a degree of transparency to infrared radiation, the measurement of the distance from the sensors to the wafer provides a measurement value $D_{TGT}$ which differs from the previously measured reference distance $D_{REF}$ to the reference surface 520 by a value which is less than the thickness of the wafer as shown in FIG. 16a. By comparing this difference value ($D_{REF}-D_{TGT}$) to the known thickness $W_{THICK}$ of the wafer, the correction factor $F_{COR}$ may be calculated as $F_{COR}=W_{THICK}-(D_{REF}-D_{TGT})$. Thus, upon activating a "calibrate target wafer" button 704 (FIG. 7A), the distance $D_{TGT}$ from the sensors to the wafer is noted for each laser head such as laser head 510r and used with the previously measured reference distance $D_{REF}$ to the reference surface 520 and the known wafer thickness $W_{THICK}$ to calculate the correction factor $F_{COR}$ for each laser head. Subsequent measurements of the distance to the wafer may then be corrected by subtracting the correction factor $F_{COR}$ from the measured distance value $D_{TGT}$ to provide the corrected distance $D_{WAF}$ which is a more accurate representation of the distance from a laser head sensor to the outer surface of the wafer.

Because the response of a target such as a silicon wafer to a distance sensor such as a laser sensor may vary from wafer to wafer, it is preferred that the same wafer be used for subsequent aligning and calibration procedures discussed below. It should also be appreciated that correction factors may be determined for other types of targets and sensors, correcting for the variations in the manner in which particular targets respond to particular sensors. In addition to placing the target wafer on the reference surface 520 for target surface calibration when the metrology cassette is placed in the inverted position, the target may also be affixed to the reference surface by an appropriate mechanism when the metrology cassette is in the noninverted position.

Cassette Handler Leveling

In aligning a wafer cassette to a robot blade, it is preferred that the wafer cassette be arranged so that wafers stacked within the cassette are as parallel as possible to a wafer held within the pocket of the robot blade when inserted into the cassette. The parameter affecting this is the alignment of the blade to the cassette slots, which are provided by thin flat or angled shelves or teeth 1912 extending outward from the sidewall of the cassette, and designed to hold the wafers parallel to the base of the cassette. Accordingly, cassette handlers typically have various adjustment mechanisms on the platform 200 of the cassette handler which adjusts the forward/backward and left/right tilt of the platform so that the base of the cassette secured to the platform, and thus the shelves upon which the wafer sits, are oriented parallel to the robot blade. These forward/backward and left/right adjustments to the platform are typically referred to as "leveling" the cassette handler although achieving a true horizontal leveling is typically not the goal.

As explained below, a cassette alignment tool system 400 in accordance with a preferred embodiment of the present invention readily permits the cassette handler to be "leveled" relative to the wafer blade both quickly and very accurately. Instead of relying upon visual estimates or the mechanical contact tools of prior methods, the cassette alignment tool system 400 of the illustrated embodiments accurately measures the left/right and forward/back displacements of a robot blade carrying a wafer relative to the reference plane 520 of the metrology cassette 410 and provides a numerical output indicating both the direction and amount of each displacement. Using this information, the operator can readily adjust cassette handler until the system 400 indicates that the amount of left/right and front/back displacements are zero or within tolerance. The following provides an example of such a cassette handler leveling operation for a typical loadlock chamber designated "LLA.".

Figure 2:
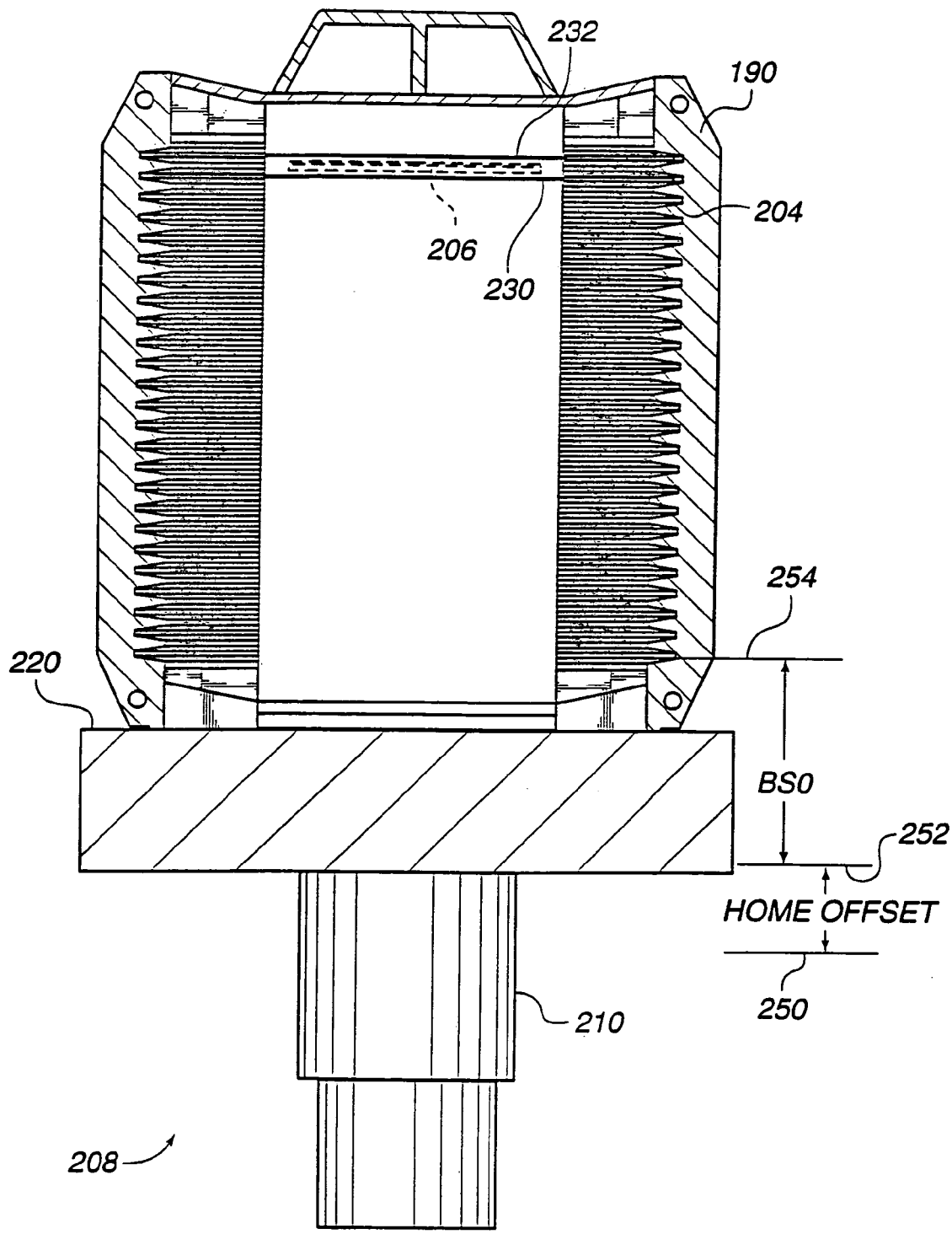
FIG. 2 is a schematic front view of a typical wafer cassette disposed on a platform of a cassette handling system.

First, the operator causes the robot to extend the robot blade into loadlock "LLA" to the "drop position" and so that the operator can place a clean wafer in the blade pocket. To facilitate light beam reflection by the wafer, it is preferred that the mirror side of the wafer be placed face up, with the dull silver side down to face the laser sensors. The robot blade is then retracted back in the transfer chamber to the zero position, with the wafer properly in the robot blade pocket. The metrology cassette 410 of the cassette alignment tool system 400 is then placed on the loadlock "LLA" cassette handler platform in the same manner as a standard plastic cassette. Using the system controller, the loadlock "LLA" cassette handler moves the metrology cassette 410 to "slot base 24." The "slot base" position is the cassette position relative to the robot blade in which the blade is preferably midway between two wafers resting in consecutive slots. For example, FIG. 2 illustrates the slot base 25 position for wafer cassette 190 which is the vertical position of the wafer cassette 190 when the robot blade 206 is midway between two wafers 230 and 232 in resting in consecutive slots 24 and 25, respectively, of the wafer cassette 190. The metrology cassette 410 of the illustrated embodiment does not have actual slots for supporting wafers. However, in that the metrology cassette 410 is emulating the wafer cassette 190, the positions of the wafer slots formed between adjacent shelves for a production cassette can be readily supplied from the cassette manufacturer, in terms of a distance offset relative to the reference plane 520. Thus, for this leveling procedure, FIG. 8 shows the effective slot base 24 position for the metrology cassette 410 when the robot blade 206 is midway between two imaginary wafers 234' and 232' resting in consecutive imaginary slots 23 and 24, respectively, of the metrology cassette 410 190. The operator may visually check the location of the metrology cassette 410 and the cassette handler to ensure that it is at "slot base 24" for load lock "LLA." The cassette alignment tool system 400 may then be calibrated by pushing the Zero button on the cassette alignment tool system 400 controller as described above to ensure that "L/R" and "F/B" displayed values on the display 530 of the interface controller are both reading 0.0000 as shown in FIG. 7. The L/R displayed value is the difference between the distance measurements of the blue and yellow laser heads 510$b$ and 510$y$, respectively, which are disposed on the left and right, respectively as shown in FIG. 6A. The F/B reading is the difference between the averaged distance measurement of the blue and yellow laser heads 510$b$ and 510$y$, respectively, which are disposed in the front of the metrology cassette 410, and the red laser head 510$r$ which is disposed in the back of the metrology cassette 410 as shown in FIG. 6A. Because the robot blade and wafer have not yet been extended into the metrology cassette 410, the light beams of the laser distance sensors will intercept the cassette reference surface 520. As previously mentioned, the distance measurements of the three lasers to the flat, parallel reference surface 520 during the "zeroing" operation are calibrated to be output as zero. Thus, the difference between the left and right laser distance measurements is assigned an L/R output of zero and the difference between the front and back laser distance measurements is assigned an F/B output of zero.

Following calibration of the lasers, the robot blade and wafer may be extended into the cassette alignment tool system 400 metrology cassette 410 preferably making sure there is no contact from the robot blade and wafer with any part of the cassette alignment tool system 400 metrology cassette 410. The robot blade and wafer may be stopped at the "wafer drop" position which is the position at which the blade drops a wafer into a slot or picks a wafer up from a slot. Transfer robot movements are typically commanded through a processing system controller.

After the robot blade is moved into the cassette, the distance $D_{WAF}$ (FIG. 8) from each laser sensor to the bottom surface of the wafer on the robot blade is measured by the three sensors. After allowing a couple of seconds for the reading on the display 530 of the interface controller to stabilize, the outputs labeled "L/R" and "F/B" may be noted. The offset distances DOFF from the reference surface 520 to the wafer ($D_{REF}$–$D_{WAF}$) may then be displayed for each laser head as shown in FIG. 11. In the example of FIG. 11, the offset distance $D_{OFF}$ for each laser sensor is displayed as 1.333 which will be the same for each sensor if the robot blade is properly leveled relative to the cassette reference surface 520. Since the L/R displayed value is the difference between the distance measurements of the blue and yellow laser heads 510$b$ and 510$y$, respectively, which are disposed on the left and right, respectively as shown in FIG. 6A, the L/R displayed value will be 0.0000 if the cassette is properly leveled in the left-right direction. Similar, because the F/B reading is the difference between the averaged distance measurement of the blue and yellow laser heads 510$b$ and 510$y$, respectively, which are disposed in the front of the metrology cassette 410, and the red laser head 510$r$ which is disposed in the back of the metrology cassette 410 as shown in FIG. 6A, the F/B displayed value will be 0.0000 if the cassette is properly leveled in the front-back direction. Thus, if the cassette is leveled to the robot blade both readings will be 0.0000. If not, the cassette will need to be leveled relative to the robot blade.

The cassette handler of the illustrated embodiment has three leveling screws which may be individually adjusted to change the front/back and left/right orientation of the platform 200, and thus the cassette to the robot blade. These leveling screws are graphically represented in a convenient computer display output 800 shown in FIG. 9, the relevant portion of which is shown in an enlarged view in FIG. 10. As shown therein, the three leveling screws are labeled #1, #2 and #3, respectively.

The following provides an example of use of a cassette alignment tool in accordance with an embodiment of the present invention for leveling a cassette handler. Of course, the procedure may be readily modified to accommodate the particular leveling adjustment mechanism of the particular handler being used.

First, the operator levels the handler in the front to back (F/B) direction by adjusting the slotted screw labeled #1 about ¼ of a turn clockwise (CC) for example, and allowing the F/B measurement displayed by the interface controller display 530 (FIG. 11) to stabilize after the change. If the F/B reading becomes a smaller value (closer to the 0.000), the operator should continue to adjust the #1 screw until the F/B becomes 0.000. If the display F/B value becomes larger, the operator can turn the #1 screw counterclockwise (CCW). It is preferred that the operator make small adjustments, waiting for the display reading to stabilize before the operator makes the next adjustment.

Next, the handler may be leveled in the left to right (L/R) direction by adjusting the slotted screw labeled #3 using the same method of adjustment described above. The operator preferably should not need to adjust slotted screw #2 unless the operator cannot level the cassette within the desired tolerance such as 0.0020, for example, in both the F/B and L/R directions. When both of the F/B and L/R readings are 0.0020 or better, the cassette platform is level to the robot blade.

As previously mentioned, the metrology cassette 410 is emulating the wafer cassette 190. In that the dimensions of the blade, wafer and wafer cassette are known or can be measured, a preferred slot base position can be calculated for each slot base of the cassette 190. Such a preferred slot base position for slot base 24 is represented as a height $H_{sb}$ (FIG. 8) above the plane of the base plane 220 of the platform 200.

Similarly, the calculated preferred slot base position may represented as an offset distance $D_{sb}$ from the cassette reference surface 520.

To facilitate leveling the cassette relative to the robot blade, the laser distance measurements by the laser sensors to the underside of the wafer held by the robot blade relative to the reference surface 520 when the robot blade is inserted into the cassette may be output to the operator as displacements from the calculated preferred slot base position $D_{sb}$ measured from the cassette reference surface 520.

Figure 9:
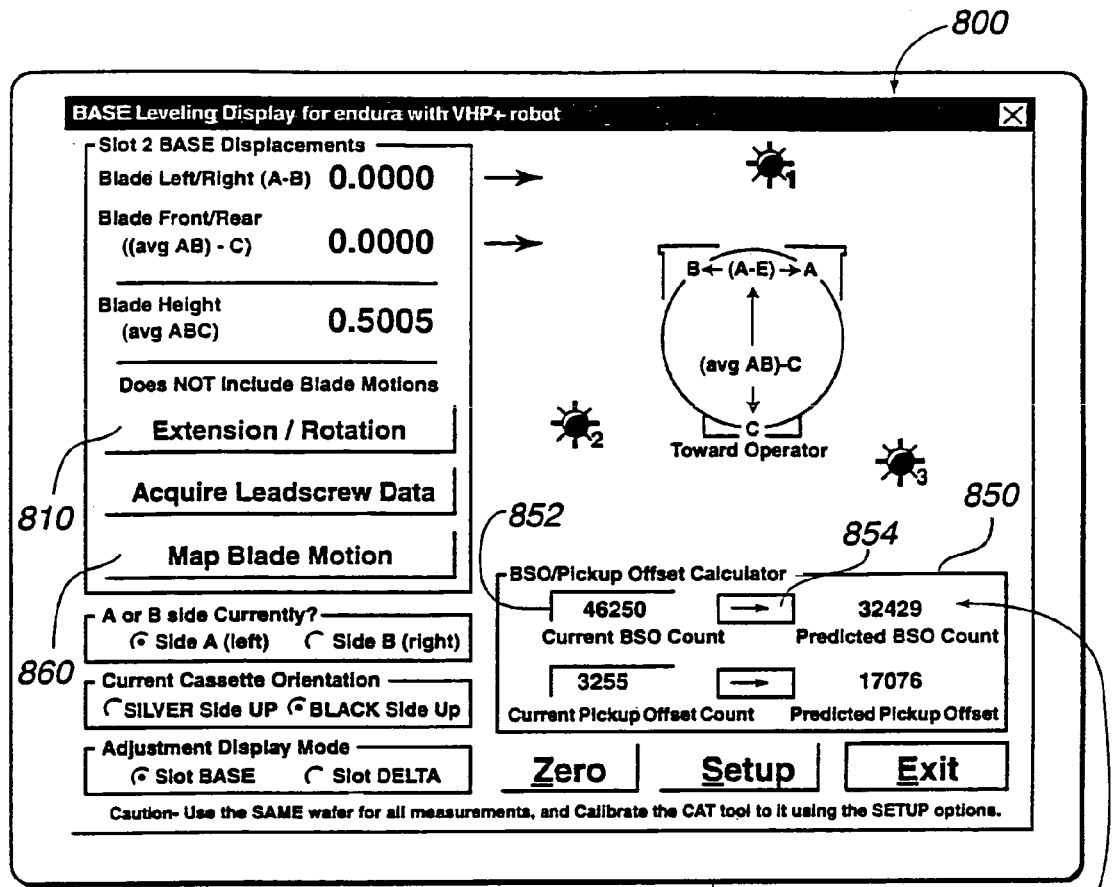
FIG. 9 is a view of the computer display of FIG. 4, depicting an input-output screen used in a leveling procedure.
Figure 10:
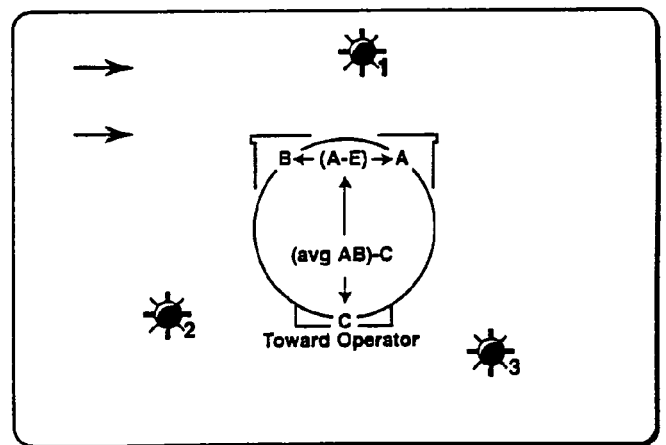
FIG. 10 is an enlarged view of a portion of the screen of FIG. 9, graphically depicting the leveling inputs for a typical cassette handler platform.

FIG. 9 shows the computer display screen 800 having an output labeled "Blade Left/Right (A-B)" which is similar to the L/R output of the interface controller display discussed above. However, the displayed value "A-B" is the difference between the two displacements, one measured by the blue (left) laser 510b and one measured by the yellow (right) laser 510y, from the calculated preferred slot base position $D_{sb}$. Another output labeled "Blade Front/Rear (avg AB)-C)" is similar to the F/B output of the interface controller display but the value "C" is the displacement measured by the red (back) laser 510r, from the calculated preferred slot base position $D_{sb}$. If the cassette is leveled to the robot blade, both readings will be 0.0000 because the displacements from the preferred slot base position will be zero for each laser, indicating a level condition. If not, the operator can level the cassette to the robot blade in the same manner described above, adjusting the leveling screws until the desired 0.0000 readings (or within tolerance) are obtained.

Robot Blade Extension and Rotation Alignment

Figure 1:
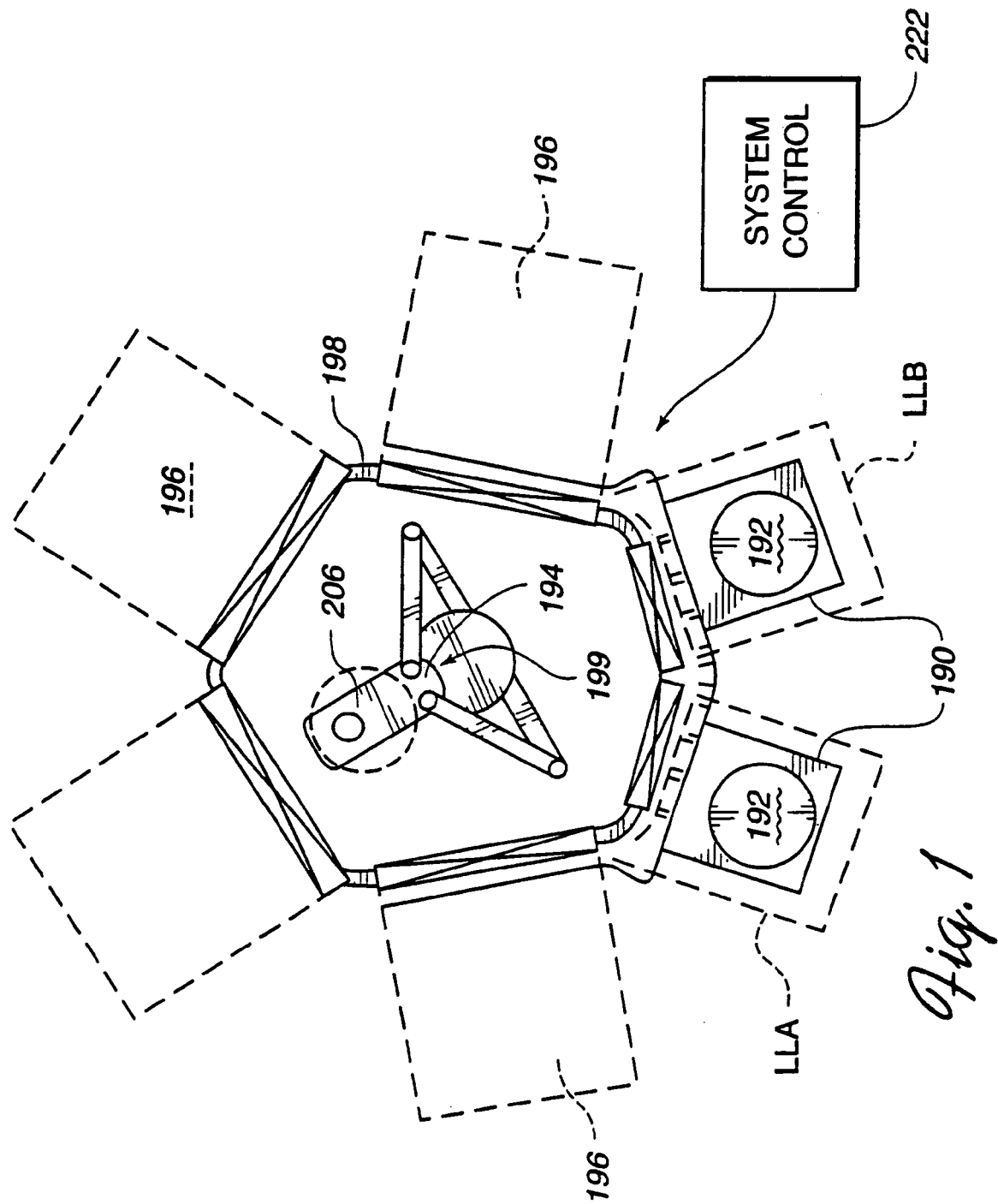
FIG. 1 is a schematic top view of a typical deposition chamber having two loadlock chambers.

In addition to leveling the cassette to the wafer blade, it is also very useful to properly set the "wafer drop" or "wafer pick" position of the wafer blade relative to the cassette. As set forth above, the "wafer drop" position is usually the same as the "wafer pick" position and is the position at which the blade drops a wafer into a slot or picks a wafer up from a slot. In many processing systems, the transfer robot can move the wafer blade in a rotational movement centered about a pivot point 199 (FIG. 1) on the robot shoulder. In addition, the blade can be extended radially outward and withdrawn radially inward in a translational movement. These movements commanded through the processing system controller are typically defined in terms of a rotation count and an extension step count. Each extension step represents an incremental translation movement of the robot blade and each rotation count represents an incremental rotational movement of the blade. The system controller can cause the blade to rotate and then extend or to both rotate and extend in combined motions in response to rotation step commands and extension step commands inputted to the system controller by the operator.

In accordance with another aspect of the illustrated embodiments, the metrology cassette 410 has an alignment hole 600 (FIG. 12a) in the top plate 612 which permits an alignment plug 614 (FIG. 12b) to be inserted through the cassette top plate alignment hole 600 and through a similar alignment hole 616 in the robot blade 206 when the robot blade is properly positioned in the drop/pickup position as shown in FIG. 12c. Furthermore, the cassette alignment tool system 400 can provide a graphical operator interface which facilitates the blade extension and rotation alignment procedure.

As used herein, the term blade refers to the wafer blade 206 illustrated and discussed as well as other robot hands for holding a wafer or other semiconductor workpiece such as a display panel substrate, which is loaded and unloaded from a cassette in a semiconductor processing system.

Figure 13:
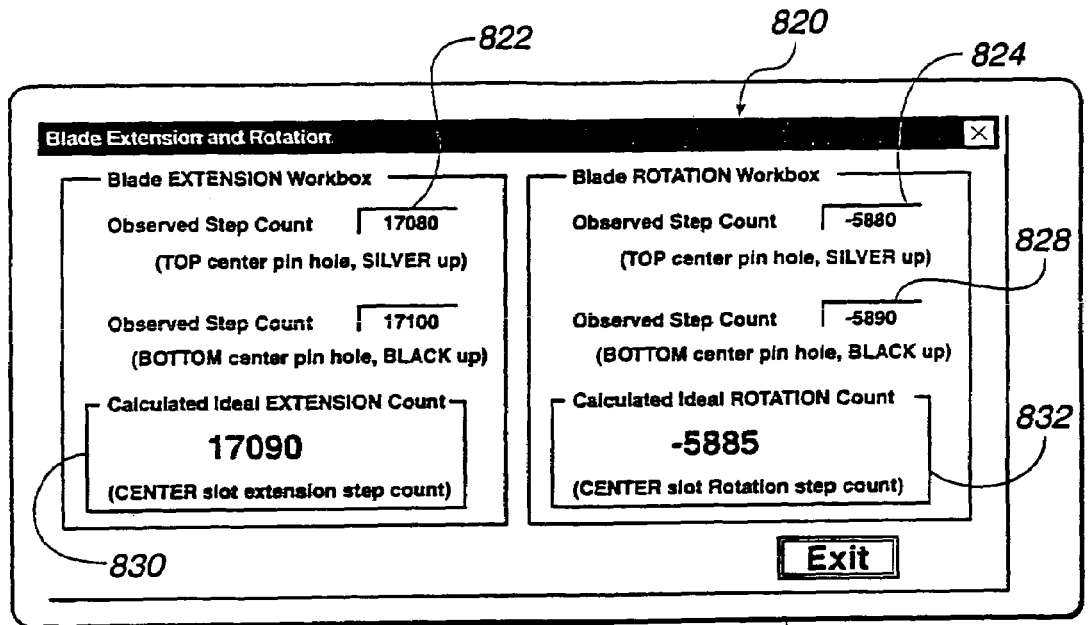
FIG. 13 is a view of the computer display of FIG. 4, depicting an input-output screen used in an extension and rotation alignment procedure.

Referring now to FIG. 9, the operator may select the "Extension/Rotation" button 810 of the Leveling Display 800 by moving the computer display cursor to the Extension/Rotation button 810 and clicking the left mouse button. A Blade Extension and Rotation worksheet 820 will pop up on the computer display screen, as shown in FIG. 13.

To ready the cassette alignment tool system 400 for the rotation and extension alignment procedure, the metrology cassette 410 is placed on the cassette handler of a loadlock such as loadlock "LLA" with the top plate 612 up as shown in FIG. 12b and the cassette alignment surfaces such as the H-bar 430 of the bottom plate 630 properly registered with the handler alignment surfaces of the platform 200. The operator then causes the processing system controller to move the loadlock "LLA" cassette handler to slot base #24 and then extend the robot blade to the Drop Position/Pick Position of loadlock "LLA" as shown in the side view of FIG. 12b. The operator may then insert the Extension/Rotation Alignment Plug 614 into the alignment hole 600 in the top plate to determine if the barrel end 615 of the alignment plug 614 is aligned with an alignment hole 616 in the robot blade. If the robot blade alignment hole 616 is properly aligned with end 615 of the alignment plug 614 and hence the cassette alignment hole 600, the end 615 of the alignment plug 614 will pass through the blade alignment hole 616 as shown in the cassette front view of FIG. 12c and the cassette top view of FIG. 12d. In the illustrated embodiment, the alignment hole 600 and the blade alignment hole 616, each has a diameter of ⅛" but may of course have other dimensions and placements, depending upon the application. Furthermore, the alignment surfaces of the metrology cassette, the alignment plug and the robot blade may have a variety of shapes and positions other than the cylindrical shapes illustrated.

To align to the blade alignment hole 616 to the alignment plug end 615, the operator may command the processing system controller to make small adjustments in the current settings of the blade extension count to extend or withdraw the blade, and in the blade rotation count to rotate the blade either clockwise or counter-clockwise as needed. When the operator has adjusted the robot blade to the proper Extension/Rotation position, the alignment plug end 615 should drop through the alignment hole 616 in the robot blade easily with no help or force from the operator.

The operator can record both the readings of the "Blade Extension Step Count" and the "Blade Rotation Step Count" on the Blade Extension Rotation worksheet 820 (FIG. 13) in windows provided for that purpose. As an example, the value 17080 has been entered in an upper left window 822 for the "Extension Step Count." Similarly, the value −5880 has been entered in an upper right window 824 for the "Rotation Step Count."

Figure 14A:
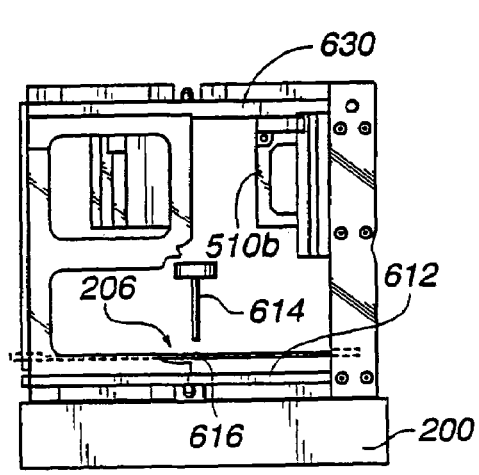
FIG. 14a is a partial side view of the metrology cassette of FIG. 4 illustrating insertion of an alignment pin during an extension and rotation alignment procedure when the cassette is in an inverted position.

In accordance with another aspect of the illustrated embodiments, the top plate 612 of the metrology cassette 400 has cassette alignment and registration surfaces including an H-bar 622 in the same manner as the bottom plate 630 which permits the metrology cassette 400 to be inverted so that the top plate 612 engages and aligns to the handler platform 200 as shown in FIG. 14a. As a consequence, the alignment hole 600 in the plate 612 of the metrology cassette 400 may be used to align the robot blade rotation and extension positions when the blade is in a substantially lower slot base position such as slot base #2.

Figure 14B:
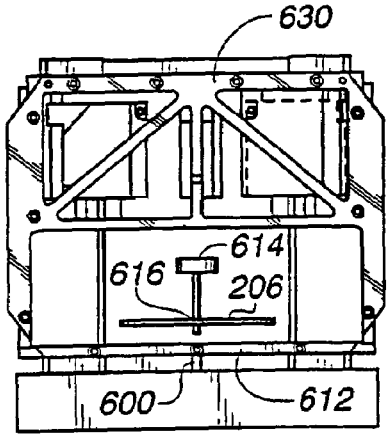
FIG. 14b is a front view of the metrology cassette of FIG. 4 illustrating insertion of an alignment pin during an extension and rotation alignment procedure when the cassette is in an inverted position.

Accordingly, after inverting and reseating the metrology cassette 400 as shown in FIG. 14a, the operator causes the processing system controller to move the loadlock "LLA" cassette handler to slot base #24 and then extend the robot blade to the Drop Position/Pick Position of loadlock "LLA." The operator may then insert the Extension/Rotation Alignment Plug 614 into the robot blade alignment hole 616 as shown in FIG. 14b to determine if the barrel end of the alignment plug 614 is aligned with an alignment hole 600 of the cassette plate 612. If the alignment blade alignment hole 616 is properly aligned with the cassette alignment hole 600, the end 615 of the alignment plug 614 will pass through the plate alignment hole 600. Again, when the operator has adjusted the robot blade to the proper Extension/Rotation position, the alignment plug end 615 should drop through the alignment hole 600 in the cassette plate easily with no help or force from the operator.

The operator can record both the readings of the "Blade Extension Step Count" and the "Blade Rotation Step Count" for slot base #2 on the Blade Extension Rotation worksheet 820 (FIG. 13) in windows provided for that purpose. As an example, the value 17100 has been entered in a lower left window 826 for the "Extension Step Count." Similarly, the value −5890 has been entered in a lower right window 828 for the "Rotation Step Count."

The values of the rotation and extension step counts for either or both of the slot base positions may be entered into the processing system controller for controlling the movements of the robot blade to set the blade extension and rotation counts for the blade dropoff/pickup position for the loadlock chamber. Alternatively, and in accordance with another aspect of the illustrated embodiments, the cassette alignment tool system 400 can automatically calculate and display an average of the Extension Step Count from both readings taken at slot base #24 and slot base #2, respectively, and also an average of the Rotation Step Count from both readings taken at slot base #24 and slot base #2, respectively. In the illustrated embodiment, these averages are displayed as bold numbers at the bottom of the Blade Extension and Rotation screen 820 in the boxes 830 and 832, labeled Calculated Ideal EXTENSION Count and Calculated Ideal ROTATION Count, respectively. For example, FIG. 13 shows a Calculated Ideal EXTENSION Count number to be 17090 and a Calculated Ideal ROTATION Count number to be −5885. These calculated average values may be input into the processing system controller for controlling the movements of the robot blade to set the blade extension and rotation counts for the blade dropoff/pickup position for the loadlock chamber.

The metrology cassette 410 may be used with a variety of robots, robot blades, elevators, system controllers and cassettes other than those depicted and described to align and set a variety of blade/cassette positions other than those described.

Height Alignment

In accordance with another aspect of the illustrated embodiments, the cassette alignment tool system 400 provides a convenient means to measure the height of a wafer on the robot blade at various positions relative to the loadlock cassette platform. These measurements can be used to ensure, for example, that the robot blade is at the "slot base" and "slot delta" heights appropriate for the particular wafer cassette. The system may also be used to verify and correct other heights as well, depending upon the application.

Figure 3:
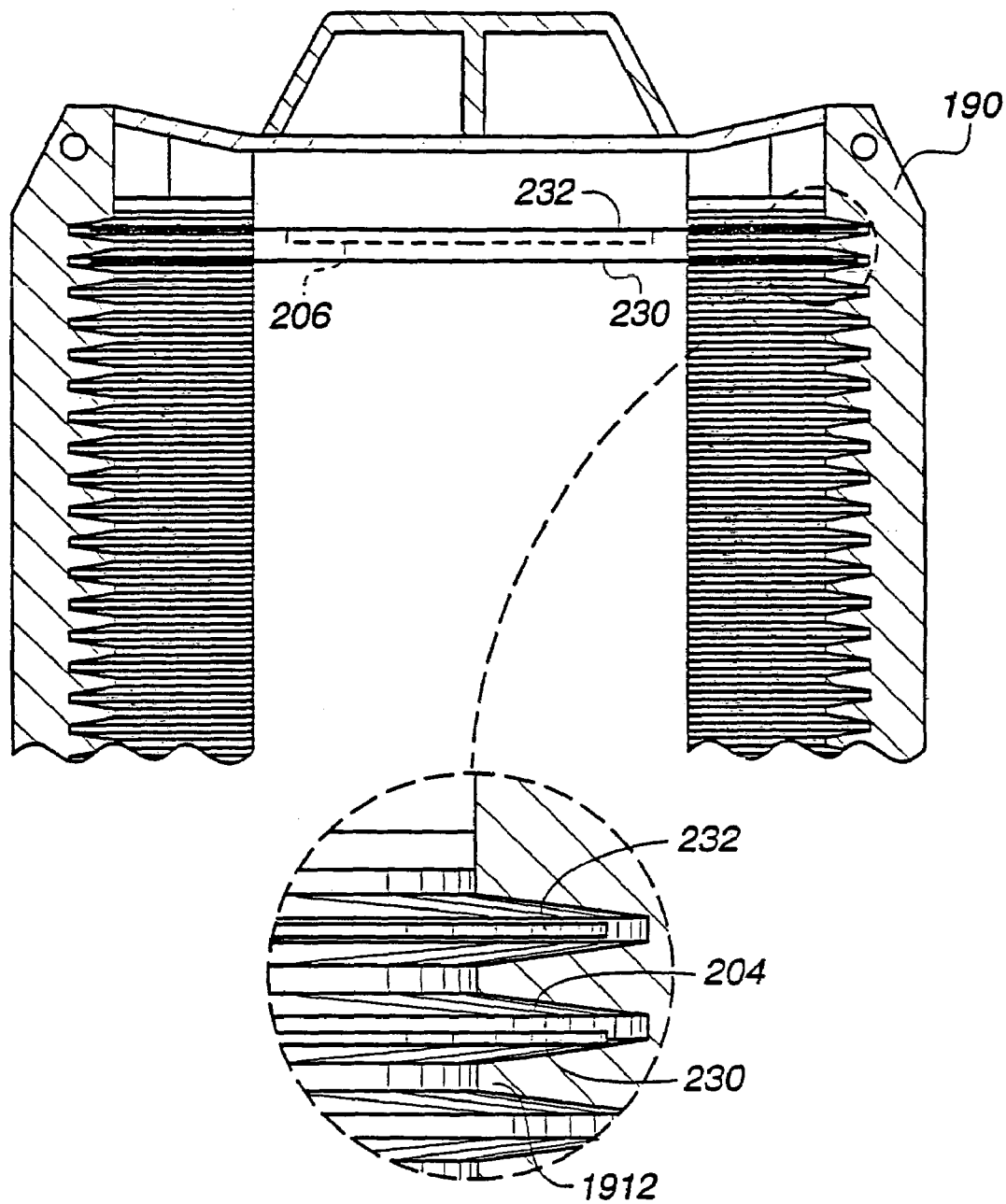
FIG. 3 is a partial view of the wafer cassette of FIG. 2, depicting a wafer resting in a slot and a wafer picked up from a slot.

As previously mentioned, the slot base height is the vertical position of a wafer cassette when the robot blade 206 and the wafer carried by the blade 206 are midway between two wafers in consecutive slots of the wafer cassette. FIGS. 3 and 3a illustrate the slot delta height which is the vertical offset of the wafer cassette above the slot base position when a wafer such as the wafer 232 carried by the blade 206 is centered in the slot.

As shown in FIG. 2, the platform has a physical home position indicated at 250 which is the lowest point to which the elevator can lower the platform 220. Above the physical home position 250 is a "logical" home position 252 which is displaced from the physical home position 250 by a distance often referred to as the "home offset" which is expressed in terms of the number of incremental steps which are necessary for the elevator 210 to move the platform 220 from the physical home position 250 to the logical home position 252. The number of steps necessary for the elevator to move the platform a unit distance (expressed in English or metric units) is referred to as the "pitch" of the elevator. The logical home position expressed in terms of a step count may be assigned the step count "0" position. Above the logical home position is a position of the platform in which the cassette carried by the platform is at one of the slot base positions. For cassette 190, the bottom-most slot is slot #1. The platform position which positions the cassette at a slot base position which corresponds to cassette position slot base #1 is indicated at 254 in FIG. 2. The distance between the bottom slot base position 254 and the logical home position is often referred to as the "bottom slot offset" (BSO) and is expressed in terms of a step count.

To change the height of the robot blade to the height of a particular slot base position, the cassette handler system is commanded to elevate the cassette so that the robot blade and the wafer carried by the blade are at the desired slot base height relative to the cassette. If the BSO count is properly set into the cassette handler system, the cassette will be elevated to the appropriate height relative to the robot blade such that the robot blade and the wafer carried by the robot blade will be at the desired slot base height. If the BSO is not properly set, the robot blade and the wafer carried by the blade may strike an adjacent wafer or slot as the robot blade is moved inward between two adjacent slots.

In accordance with another aspect of the illustrated embodiments, the height of a wafer carried by the blade relative to the cassette may be accurately measured and compared to a preferred height for performing a particular operation. For example, as explained in greater detail below, a preferred slot base height may be calculated based upon the dimensions of the wafer cassette being emulated and the dimensions of the wafer. When the cassette handler system is commanded to elevate the metrology cassette relative to the robot blade which changes the height of the cassette to a particular slot base height, the actual height of the blade relative to the metrology cassette may then be precisely measured and compared to the expected blade height or preferred slot base height. Any difference between the measured and expected heights can be determined as a numerical correction factor and appropriate corrections may be made to the cassette handler system to ensure that the robot blade is at the preferred slot base height. In a similar manner, the slot delta height can also be verified and corrected.

To measure the height of the robot blade and the wafer carried by the blade, it is preferred that the laser sensors first be calibrated as set forth above. Thus, before the robot blade is moved into the cassette, the distance $D_{REF}$ from each laser sensor to the reference surface 520 of the metrology cassette is measured by each of the three sensors. In the illustrated embodiment, it is preferred that the measured distances be displayed as offset distances from the reference surface 520. Thus, after the "zero" button on the interface controller is depressed, the measured distance value $D_{REF}$ for each laser is output as zero as shown in FIG. 7. After the robot blade is moved into the cassette, the distance $D_{WAF}$ (FIG. 8) from each laser sensor to the bottom surface of the wafer on the robot blade is measured by the three sensors. The offset distance $D_{OFF}$ from the reference surface 520 to the wafer ($D_{REF}$–$D_{WAF}$) may then be displayed as shown in FIG. 11. In the example of FIG. 11, the offset distance $D_{OFF}$ for each laser sensor is displayed as 1.333 which will be the same for each sensor if the robot blade is properly leveled relative to the cassette reference surface 520 as discussed above. These measurements may be compared to expected offsets for a particular slot base position to determine if the robot blade and the wafer carried by the blade are indeed at the desired slot base position. If not, the numerical difference between the measured offset distances and the expected offset distances indicate both the amount and direction of the appropriate corrections which can be made to the cassette handler system to ensure that the blade and its wafer are moved to the desired slot base position or other desired position.

In an alternative embodiment, the expected distance measurements when the blade and its wafer are at the preferred slot base position, may be inputted to the cassette alignment tool system or calculated internally by the cassette alignment tool system as discussed below. Thus, when the cassette alignment tool system 400 measures the blade and wafer height using the laser sensors, the output may be expressed in terms of a displacement from the calculated preferred blade height for that position. For example, if the cassette handler is commanded to move the cassette to slot base #24, the measured blade position may be displayed as a displacement from the calculated preferred slot base #24 position. FIG. 9 of the illustrated embodiment shows an example of such a slot base #24 displacement having a value of 0.5005 as an average of the three measured displacements of the three laser sensors. If the platform positions the cassette relative to the robot blade such that the robot blade is measured to be at the preferred slot base height, the displayed blade height value will be zero. If a nonzero blade height measurement such as the 0.5005 value is displayed, the blade height relative to the cassette may be adjusted. In the illustrated embodiment, such adjustments are preferably made by modifying the bottom slot offset step count input to the cassette handler system.

The adjustment to the bottom slot offset count can be accomplished empirically. That is, after determining the present bottom slot offset count input into the system, the operator can make an educated guess based upon the magnitude and the sign of the displayed blade height displacement as to the amount of the count correction and the direction of the count correction (either add or subtract) to modify the bottom slot offset count setting. As set forth above, the height of the cassette relative to the robot blade at a particular slot base position may be modified by modifying the bottom slot offset (BSO) setting of the cassette handler system. After the operator modifies the bottom slot offset setting, the cassette handler system may be commanded again to move the cassette to slot base #24 using the new BSO setting. The laser sensors will measure the blade position relative to the metrology cassette reference surface 520 and again, the cassette alignment tool system will display the measured displacement of the blade from the expected slot base #24 height. If necessary the BSO may be corrected again and the cassette handler commanded to move the blade to slot base #24 again. This process may be continued until the displayed blade height displacement value is "zero," indicating that the height of the blade is precisely at the calculated preferred height for slot base #24.

In accordance with another aspect of the illustrated embodiment, the setting of the bottom slot offset value may be facilitated by the cassette alignment tool system by an offset position calculator which calculates an expected count value for an offset such as the bottom slot offset. This expected count value is calculated based upon the distance that the cassette handler elevator elevates the cassette for each step and the measured displacement of the robot blade/wafer from the expected position. The number of steps per unit distance for the cassette handler elevator may be a known quantity for a particular elevator. Alternatively, the step per distance value may be measured by the cassette alignment tool as discussed in greater detail below.

FIG. 9 shows an example of such an offset calculator at 850 in the display screen 800. The calculator 850 labeled "BSO/Pickup Offset Calculator" may be used as follows. After commanding the cassette handler system to move the cassette to a slot base position such as slot base #24, the laser sensors measure the wafer/blade position and output the measured displacement from the calculated preferred slot base position as discussed above. The operator may then enter the current BSO number (such as 46250, for example) into the "Current BSO Count" box 852 on the system display screen 800 and clicking on the arrow button 854 next to it. The operator may then read the predicted new BSO number from the result box 856 to the right.

Figure 21:
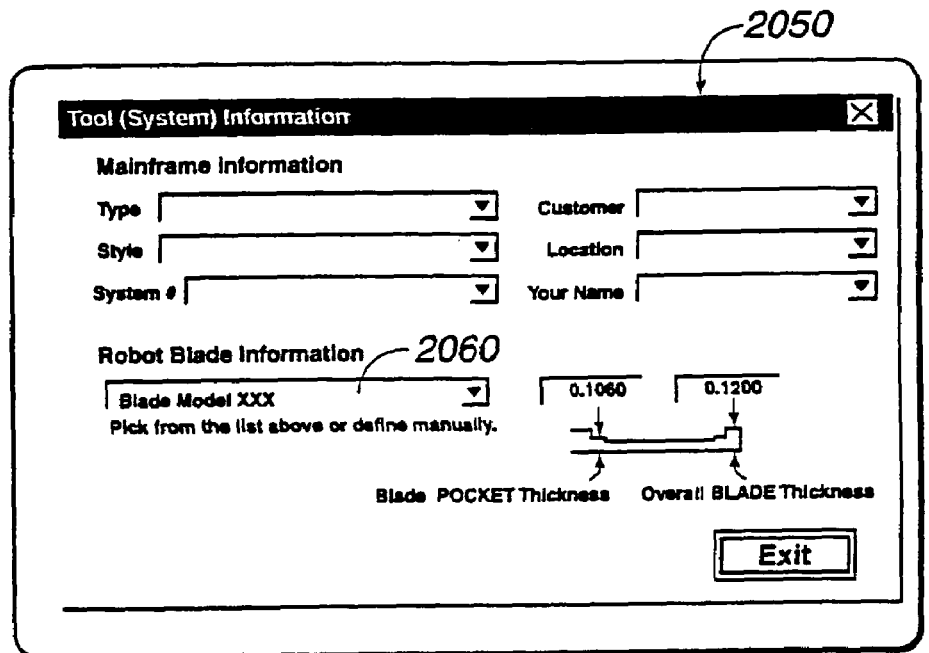
FIG. 21 is a view of the computer display of FIG. 4, depicting an input-output screen used to input robot blade dimensions.

The new BSO number (such as 32429, for example) is automatically determined by the cassette alignment tool system 400 by multiplying the displayed blade height displacement (such as 0.5005, for example) by the elevator's steps per inch value. This product, either a positive or negative step count value, indicates the number of steps which is preferably added to (or subtracted from) the current BSO number to reposition the cassette at the preferred slot base height. This number may be entered into a system constants entry page (such as the system tool page of FIG. 21) as the new BSO.

After the operator modifies the bottom slot offset setting, the cassette handler system may be commanded again to move the cassette to slot base #24 using the new BSO setting of 185742. The laser sensors will again measure the blade position relative to the metrology cassette reference surface 520 and again, the cassette alignment tool system will display the measured displacement of the blade from the expected slot base #24 height. If the BSO setting is correct, the displayed blade displacement value will be zero (or sufficiently small within tolerance). If necessary the BSO may be calculated again as described above, entering the "current" BSO value 185742 into the entry box 852 and clicking the entry button 854 to obtain the new BSO value. This process may be continued until the displayed blade height displacement value is "zero," indicating that the height of the blade is precisely at the calculated preferred height for slot base #24.

The blade/wafer height measurement process and apparatus of the illustrated embodiment has been discussed in connection with measuring the blade/wafer height relative to the metrology cassette when the cassette handler has been commanded to move to a slot base position. It should be appreciated that the blade/wafer height may be measured at other positions as well. For example, the blade/wafer height may be measured at a slot delta position as shown by the computer input-output screen 1600 depicted in FIG. 15. In this example, the input-output screen 1600 indicates height measurements at the slot 24 delta position. Here too, the height of a wafer carried by the blade relative to the cassette may be accurately measured and compared to a preferred height for the slot delta position which may be calculated based upon the dimensions of the wafer cassette being emulated and the dimensions of the wafer, as explained in greater detail below.

After commanding the cassette handler to move the metrology cassette to the slot #24 delta position and calibrating the distance sensor as described above, the robot blade is moved into the metrology cassette, the distance $D_{WAF}$ from each laser sensor to the bottom surface of the wafer on the robot blade is measured by the three sensors. The offset distance $D_{OFF}$ from the reference surface 520 to the wafer ($D_{REF}$–$D_{WAF}$) may then be displayed as shown in FIG. 11. These measurements may be compared to expected offsets for a particular slot delta position to determine if the robot blade and the wafer carried by the blade are indeed at the desired slot delta position. If not, the numerical difference between the measured offset distances and the expected offset distances indicate both the amount and direction of the appropriate corrections which can be made to the cassette handler system to ensure that the blade and its wafer are moved to the desired slot delta position or other desired position.

Figure 15:
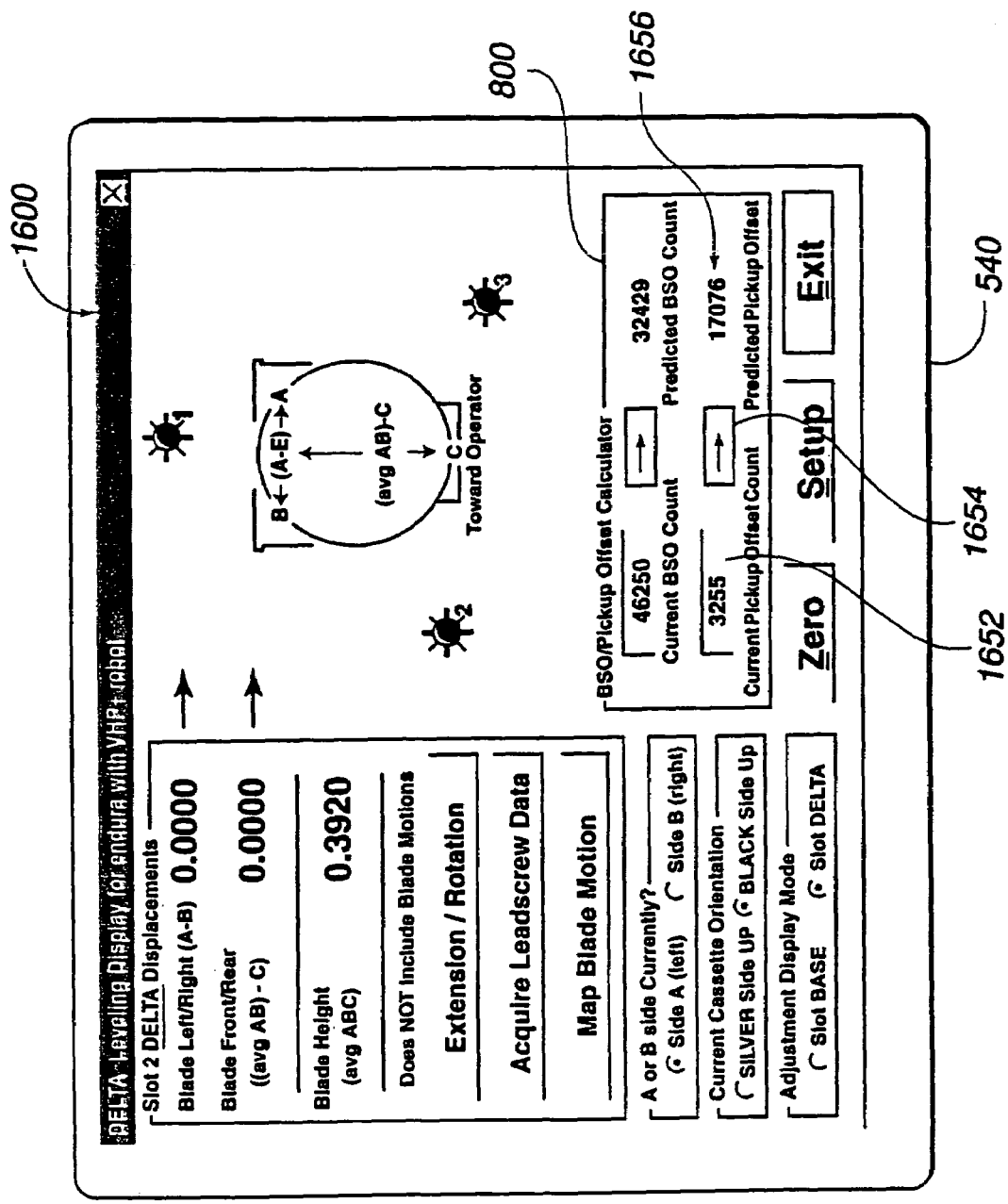
FIG. 15 is a view of the computer display of FIG. 4, depicting an input-output screen used in height measurement procedure for a slot delta position.

In the same manner as the slot base position, the expected distance measurements when the blade and its wafer are at the preferred slot delta position, may be inputted to the cassette alignment tool system or calculated internally by the cassette alignment tool system as discussed below. Thus, when the cassette alignment tool system 400 measures the blade and wafer height using the laser sensors, the output may be expressed in terms of a displacement from the calculated preferred blade height for that slot delta position. For example, if the cassette handler is commanded to move the cassette to slot delta #24, the measured blade position may be displayed as a displacement from the calculated preferred slot delta #24 position. FIG. 15 of the illustrated embodiment shows an example of such a slot delta #24 displacement having a value of 0.3920 as an average of the three measured displacements of the three laser sensors. If the platform positions the cassette relative to the robot blade such that the robot blade is measured to be at the preferred slot delta height, the displayed blade height value will be zero. If a nonzero blade height measurement such as the 0.3920 value is displayed, the blade height relative to the cassette may be adjusted. In the illustrated embodiment, such adjustments to the slot delta height are preferably made by modifying the pickup offset step count input to the cassette handler system. The pickup offset step count is the offset as measured in terms of the number of steps, that the slot delta position is above the slot base position for a particular slot.

The adjustment to the pickup offset count can be accomplished empirically. That is, after determining the present pickup offset count input into the system, the operator can make an educated guess based upon the magnitude and the sign of the displayed blade height displacement as to the amount of the count correction and the direction of the count correction (either add or subtract) to modify the pickup offset count setting. As set forth above, the height of the cassette relative to the robot blade at a particular slot delta position may be modified by modifying the pickup offset (BSO) setting of the cassette handler system. After the operator modifies the pickup offset setting, the cassette handler system may be commanded again to move the cassette to slot delta #24 using the new Pickup offset setting. The laser sensors will measure the blade position relative to the metrology cassette reference surface 520 and again, the cassette alignment tool system will display the measured displacement of the blade from the expected slot delta #24 height. If necessary the Pickup offset may be corrected again and the cassette handler commanded to move the blade to slot delta #24 again. This process may be continued until the displayed blade height displacement value is "zero", indicating that the height of the blade is precisely at the calculated preferred height for slot delta #24.

In accordance with another aspect of the illustrated embodiment, the setting of the Pickup offset value may be facilitated by the cassette alignment tool system by an offset position calculator which calculates an expected count value for an offset such as the Pickup offset in the same manner as the bottom slot offset calculator. Thus, here too the expected count value is calculated based upon the distance that the cassette handler elevator elevates the cassette for each step and the measured displacement of the robot blade/wafer from the expected position.

FIG. 15 shows an example of such an offset calculator at 800 in the display screen 1600. The calculator 800 labeled "BSO/Pickup Offset Calculator" may be used as follows. After commanding the cassette handler system to move the cassette to a slot delta position such as slot delta #24, the laser sensors measure the wafer/blade position and output the measured displacement from the calculated preferred slot delta position as discussed above. The operator may then enter the current pickup offset number (such as 3255, for example) into the "Current Pickup offset Count" box 1652 on the system display screen 1600 and clicking on the arrow button 1654 next to it. The operator may then read the predicted new Pickup offset number from the result box 1656 to the right. The new Pickup offset number (such as 17076, for example) is automatically determined by the cassette alignment tool system 400 by multiplying the displayed blade height displacement (such as 0.3920, for example) by the elevator's steps per inch value. This product, either a positive or negative step count value, indicates the number of steps which is preferably added to (or subtracted from) the current Pickup offset number to reposition the cassette at the preferred slot delta height. This number may be entered into a system constants entry page (such as the system tool page of FIG. 21) as the new Pickup offset. After the operator modifies the pickup offset setting, the cassette handler system may be commanded again to move the cassette to slot delta #24 using the new Pickup offset setting of 17076. The laser sensors will again measure the blade position relative to the metrology cassette reference surface 520 and again, the cassette alignment tool system will display the measured displacement of the blade from the expected slot delta #24 height. If the Pickup offset setting is correct, the displayed blade displacement value will be zero (or sufficiently small within tolerance). If necessary the Pickup offset may be calculated again as described above, entering the "current" Pickup offset value 17076 into the entry box 1652 and clicking the entry button 1654 to obtain the new Pickup offset value. This process may be continued until the displayed blade height displacement value is "zero," indicating that the height of the blade is precisely at the calculated preferred height for slot delta #24.

Lower Slot Position Calibration

In accordance with yet another aspect of the illustrated embodiments, the metrology cassette may be inverted and replaced onto the cassette handler platform to facilitate blade/wafer height measurements at the lower slot number positions. For example, FIG. 16 shows the metrology cassette 410 in the inverted position in which the precision internal reference surface 520 which provides a fixed reference point from which all measurements may be gauged, is fixed adjacent the support 200, to emulate the bottom of a cassette whereas the laser sensors are spaced from the support in a position at the top of a production cassette. In the illustrated embodiment, the plate 612 and the associated registration surfaces of the metrology cassette 410 are manufactured so that the reference surface 520 is relatively flat and parallel with respect to the base plane 220 of the platform 200 of the cassette handler to a relatively high degree of precision in the inverted position as well the noninverted position depicted in FIG. 5. The distance $D_{INV}$ between the reference surface 520 in the inverted position and the base plane 220 of the platform 200 is known. Again, like the noninverted position, all subsequent distance measurements of the wafer can be made as offsets to this reference surface 520. Thus, the wafer position in a position such as the slot #2 base may be calculated as the difference or offset $D_{OFF}$ between the measured reference distance $D_{REF}$ and the measured wafer distance $D_{WAF}$ as shown in FIG. 16. The wafer offset position $D_{OFF}$ may be converted into a height measurement above the base plane 220 of the platform 200 by adding the known distance $D_{INV}$ to the measured wafer offset position $D_{OFF}$. Such inversion is useful to measure the slot base positions adjacent the support, in those applications in which the distance sensors such as the illustrated laser heads would otherwise interfere with insertion or retraction of the wafer blade.

Blade Mapping

In accordance with another aspect of the illustrated embodiment, the cassette alignment tool system 400 provides a convenient means to map the trajectory of a wafer on the robot blade (and by extension, the blade itself to ensure proper alignment to the cassette. Such a mapped trajectory may be displayed in an easy to understand graphical format for inspection by the operator as shown in the output screen 1800 (FIG. 17) of the computer display 540. This motion analysis page 1800 may be accessed using the "map blade motion" button 860 on the "leveling" page 800 of FIG. 9.

The robot arms and the attached blade may exhibit a very complex motion profile while moving into or out of a cassette. Thus, the robot arm of many wafer handling systems will typically exhibit a trajectory rise or drop motion as the blade is inserted into or withdrawn from the cassette. Many blades also exhibit a sweep motion in which the blade sweeps, or rotates about some pivot point, in left and right rotational motions. Still further, blades can exhibit a twist motion which results in changes to the side-to-side level of the blade. Accordingly, it is desired to determine the entire volume of space that is swept though by the arm, blade and workpiece during their motion, to ensure that some portion of these components will not be in an interference position with a cassette component. Such a determination can be difficult to achieve by a visual inspection of the motion.

These motion components are interrelated, and have the net effect of making the wafer/blade combination appear larger than it actually is. If for example the blade droops at the arm wrist, but the arm motion is perfectly flat, the effective space occupied by the blade during its motions would have the same thickness as the blade/wafer combination plus the amount of the droop. While an observer might detect the droop, the tendency of many operators might be to tilt the cassette to match it, believing the blade followed the path of the droop. This correction may be insufficient if the motion of the blade in the drooped orientation is not taken into account.

Similarly a change in the twist orientation or a change in the robot arm height during the motion will also increase the effective space occupied by the blade and wafer. Even if the observer follows the motion through the cassette, the level of accuracy that can be achieved is often relatively low.

Furthermore, in many wafer handling systems, and particularly in processing systems that have been in service for a long period of time, the motions of the robot arm and the loadlock elevators are often not repeatable to a high degree of precision. Withdrawing the robot blade to its zero position and extending it back out to the pickup or drop position will typically result in slightly different measured height and leveling data each time the operation is performed. This is normal and is caused by the wear and backlash in the mechanical components. Systems having newer revisions of software that incorporate backlash compensation can reduce these variations to a degree, but typically do not eliminate it entirely. As a result, programming movements of the robot blade to avoid contact with adjacent wafers and slots by observing the path of the blade during one loading or unloading operation may not prevent contact with these obstacles in a subsequent operation due to these variations.

In contrast, the cassette alignment tool system 400 of the illustrated embodiment is capable of precisely mapping many of these motions over one or more operations. As a result, a determination of the entire volume of space that is swept though by the arm and blade during its various motions is readily facilitated by the laser sensors of the metrology cassette 410. Thus, the cassette alignment tool system 400 of the illustrated embodiment is capable of mapping many of these motions with accuracy and repeatability utilizing the laser sensors of the metrology cassette. Moreover, the laser sensor data of this and each procedure of the cassette alignment tool may be readily recorded for later reference. Further, the system can indicate when robot or elevator maintenance is dictated, as where the sweep, droop and twist exceed allowable limits of the space between wafers, and it cannot be compensated by robot support 200 adjustment.

In accordance with one aspect of the illustrated embodiments, the mapping functions of the cassette alignment tool system 400 can be used to determine an outside envelope of the combination of motions, determine a mean (weighted average) path, and test these results against pre-determined limit tolerances. Once this has been done, the data can be used to suggest corrections to the operator.

Motion Envelope

As explained in greater detail below, the dimensions of the current combination of cassette, blade and wafer when input into the system can be used to calculate a pair of vertical motion limits such as the limits indicated at 1802 and 1804 in FIG. 17. These limits may be centered around a preferred centerline height 1806. These calculated limits may be overridden by means of a limits override check box 1808 at the right hand side of the display window 1800. If the "fixed limits" entry box 1810 is checked, the value shown in the selection box 1812 below is used to set the maximum robot blade motion tolerance window (MBMTW) instead of the calculated limits. For example, the number 30 displayed in the selection box 1812 sets the total dimensional limit to 0.030", 0.0175" above the 0.000 center line and 0.0175" below the 0.000 center line. The user can select other limits by choosing from the pull-down menu or entering another limit value. In this manner, a fixed motion limit envelope may be selected to override the calculated limits based on the combination of hardware items used.

The vertical motion limits 1802 and 1804 may be thought of as defining a horizontal slab of space into which all motions of the blade and wafer preferably fit to avoid contacting the cassette slots or other wafers. Pass-fail tests may then be applied to the resulting data gathered during a mapping operation.

As set forth above, the laser sensors 500 may be positioned in a triangular pattern to measure and define the plane of the wafer carried by the blade in relation to the internal reference surface 520 built into the metrology cassette 410. To begin mapping the robot blade motion, the robot blade, with the wafer in the pocket, is preferably commanded to the Pick/Drop position at slot base #24. This position may be sampled and displayed by moving the operator's cursor to the button labeled Sample and clicking the left mouse button, (or pushing the button 533 (FIG. 4) on the cassette controller labeled Select) and a triangle 1813 will appear on the graph grid at 0.000 and 0. This is the operator's first sample and the data is recorded and displayed as the initial "reference" sample 1813.

Figure 17:
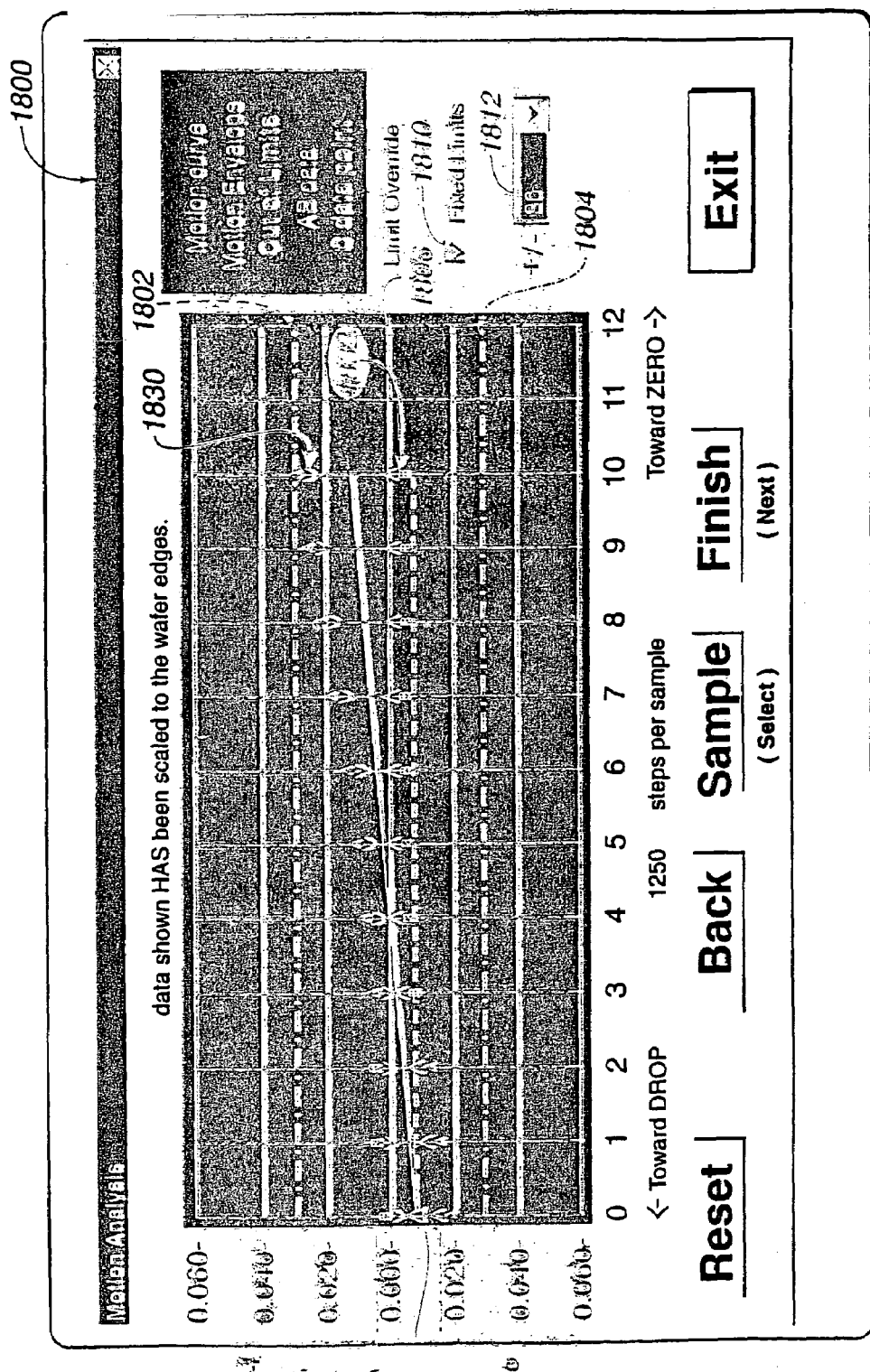
FIG. 17 is a view of the computer display of FIG. 4, depicting an input-output screen used in a blade motion mapping procedure.

Subsequent samples are recorded as the robot arm and wafer are withdrawn from the cassette in small increments as shown in FIG. 17. Each time a sample is taken, the measurement readings of the A (blue) and B (yellow) lasers (the two toward the opening of the cassette) are sampled, averaged, recorded and displayed.

To take the additional samples, the processing system may be set to permit the operator to manually step the robot blade from the Pick/Drop Position to the Zero Position at a fixed number of steps at a time. That fixed number of steps is displayed below the graph above the Sample button on the mapping display screen 1800 as shown in FIG. 17. For example, the blade may be stepped at 1250 steps per sample, each step resulting in a fixed distance movement of the blade. In this manner, the operator can input the blade lateral distance movement based on a constant distance per step, to produce the x-coordinate distance for this mapping. Each time the operator moves the blade the fixed number of steps, the operator may wait for the laser readings to stabilize (such as 5 or 10 seconds, for example) and then move the operator's cursor to the button labeled Sample (Select) and click the left mouse button, (or push the button on the cassette controller labeled Select) to record the operator's sample. The robot blade may then be stepped again and sampled again towards the Zero Position.

The average path measured by the A (blue) and B (yellow) lasers is plotted, along with a projected C (the rear (red) sensor) for each point sampled. In the graph of FIG. 17, each sampled data point representing the height measured by the A (blue) laser (the left laser) is marked on the graph using a blue downward pointing arrowhead 1830. Similarly, each sampled data point representing the height measured by the B (yellow) laser (the right laser) is marked on the graph using a yellow upward pointing arrowhead 1832. In the example illustrated in FIG. 17, the left and right sides of the blade are initially level as indicated by the overlapping arrowheads 1830 and 1832 in the initial portion of the plotted path. However, the arrow heads 1830 and 1832 progressively separate at the subsequent sample points indicating that the blade exhibits a twisting motion as it is withdrawn from the cassette.

In the illustrated embodiment, the C (red) laser beams no longer intercept the wafer once the blade and wafer begin to withdraw. Accordingly, extrapolated data rather than actual measurement data from the C laser is displayed.

When the operator has stepped the robot blade and the wafer out of the range of the last two lasers, the robot blade motion mapping session will automatically end in the illustrated embodiment. A final analysis will update the Motion Analysis graph as shown in FIG. 17. The operator may then move the operator's cursor to the button labeled Finish and click the operator's left mouse button to indicate the end of the mapping operation.

The resulting graph depicted in FIG. 17 shows the motion of the blade and wafer. At completion, the highest and lowest points in the motion can be used to define the motion envelope. These may be any of the A, B, or extrapolated C laser data points. Nonetheless, the motion profile may be examined as components of that motion. For example, the system can measure and analyze the height of a wafer carried by the robot blade relative to the metrology cassette as well as the degree of levelness between the wafer and the metrology cassette as discussed above.

The highest limit 1814 and the lowest limit 1816 of the motion envelope are averaged to find a centerline 1820 for the motion. This is in turn may be compared to a preferred centerline 1806 as calculated. The difference is shown as a deviation. This deviation or offset from the calculated preferred centerline value is also reflected back and displayed as the measured average height on the leveling page 800 (FIG. 9). The BSO value calculator on that page may be used to adjust the BSO value to cause the displayed offset value to become zero or close to it when retried. Upon rerunning the path mapping operation, the motion envelope should be centered on the calculated preferred value. Further, if the envelope thickness exceeds the allowable wafer plus robot blade allowance within the cassette, robot maintenance to correct the swing, twist, rotation, or other motion is indicated.

The cassette alignment tool system 400 also calculates a weighted mean path for the motion. This is an average path that represents the average of the entire path but compensated for the distance from the horizontal center of the path. The reason this may be helpful is that there may be short vertical excursions (humps) in the path height that would otherwise be ignored. The computed rise or fall is also displayed.

After running a motion mapping, it is preferred that the blade and wafer be returned to the Pickup or Drop position (extended) before attempting adjustments. This is because the displays on the Leveling page 800 that are affected show real-time data. If the blade and wafer are not present in the cassette, they may not be valid.

Elevator Characterization

In accordance with another aspect of the illustrated embodiment, the cassette alignment tool system 400 of the illustrated embodiment provides an apparatus and a method for measuring the motion of the elevator of the cassette handler. These elevators often include a leadscrew or other mechanism for lifting and lowering the cassette. Typically, a leadscrew mechanism includes a threaded shaft, which is coupled to a nut fixed against rotation and coupled to the cassette handler platform. Rotation of the shaft causes linear motion of the nut, and thus of the handler. The leadscrew is commanded by the operator system to elevate the cassette in steps. The actual linear distance moved by the leadscrew is referred to as the leadscrew "pitch" and is expressed in steps per inch (or steps per millimeter if metric). The precise value of the pitch for any one particular elevator may vary from cassette handler to cassette handler. Thus, the pitch value provided by the manufacturer may not provide sufficient accuracy because that value may not account for wear or for differing motor types and pulley ratios (of the pulleys connecting the motor to the shaft) that may be in use in the field. Here, using the laser distance measuring sensors that are built into the cassette alignment tool system metrology cassette 410, the operator can measure the height of a wafer on a blade at or near opposing ends of the cassette elevator's useful travel such as at slot bases 2 and 24, for example. By dividing the change in step count by the change in height, the pitch may be accurately determined. Because the elevator travel is measured over a relatively long "baseline" distance, errors are minimized.

In the illustrated embodiment, the operator measures the height of the wafer and records the elevator step count in two positions, for example, slot base 2 and slot base 24. FIG. 18 shows an entry sheet 1700 which may be implemented as a manual worksheet or as an input screen for the computer 416. To determine the height measured in inches of the wafer at the first position, e.g. slot base #24, the output readings of the three laser sensors are noted at 1702. FIG. 11 provides an example of three such output readings as displayed by the interface controller. The distance measurement output by each laser sensor corresponds to the offset distance labeled $D_{OFF}$ in FIG. 5 for each laser. As set forth above, this offset distance is the distance of the wafer from the reference surface 520. If the blade and wafer are precisely leveled, each reading should be the same. If the readings differ slightly, such as when the blade is leveled within acceptable tolerances, the three readings may be averaged and the average noted at the entry box 1704. The distance between the base plane 220 of the cassette handler platform 200 and the metrology cassette reference surface 520 in the noninverted orientation is known and is indicated in FIG. 5 as $D_{NOTINV}$. Hence, the height of the wafer above the base plane 220 of the cassette handler platform 200 at slot base #24 may be readily calculated as $D_{NOTINV} - D_{OFF}$ or $D_{NOTINV} - 1.333 = H_{SB24}$ as indicated at 1705 in the illustrated example. The current step count at slot base #24 should also be noted in the space provided at 1706.

The robot blade may then be withdrawn from the metrology cassette and the metrology cassette is then inverted as shown in FIG. 16. After commanding the cassette handler to move the metrology cassette to slot base #2, the robot blade may then be extended back into the metrology cassette and the wafer height determined and the current step count noted as shown in FIG. 18 in the same manner as that done at slot base #24.

Thus, the output readings of the three laser sensors are noted at 1732 in the input screen and the average noted at the entry box 1734. This distance measurement is the distance from the metrology cassette reference surface 520 to the top of the wafer in slot base #2. In the example of FIG. 18, this distance is measured and averaged to be 1.300.

The distance between the base plane 220 of the cassette handler platform 200 and the metrology cassette reference surface 520 in the inverted orientation is known and is indicated in FIG. 16 as $D_{INV}$. Hence, the height of the wafer above the base plane 220 of the cassette handler platform 200 at slot base #2 may be readily calculated as $D_{INV} + D_{OFF}$ or $D_{INV} + 1.300 = H_{SB2}$ as indicated at in the illustrated example. The current step count at slot base #2 is noted in the space provided at 1736.

The difference in heights and counts at the two positions is then used to calculate the number of steps per inch or millimeter. Thus, for example, if the elevator count at slot base 24 is 123456 and the elevator count at slot base 2 is 603155, the number of steps between slot base 24 and slot base 2 is 479699 (603155−123456) as indicated at 1750. Similarly, the distance between the measured heights of slot base #24 and #2 is $H_{SB24} - H_{SB2} = H_{SBF}$ inches as indicated at reference numeral 1752 in FIG. 18. Because the laser sensors measured the distance to the reference surface from the bottom of the wafer at slot base #24 and from the top of the wafer at slot base #2, the thickness of the wafer is preferably added to the measured height difference to provide a more accurate measurement as indicated at 1754 to provide a height difference measurement of $H_F$ inches. The count difference between slot bases 24 and 2 may be divided by the corresponding height difference to provide the pitch P expressed in steps per inch as indicated at 1756. This pitch may be multiplied by the slot spacing per inch value to provide a steps per slot value S as indicated at 1758. The slot spacing per inch value may be measured on the wafer cassette being emulated or obtained from the wafer cassette manufacturer's specifications for the wafer cassette.

Figure 18A:
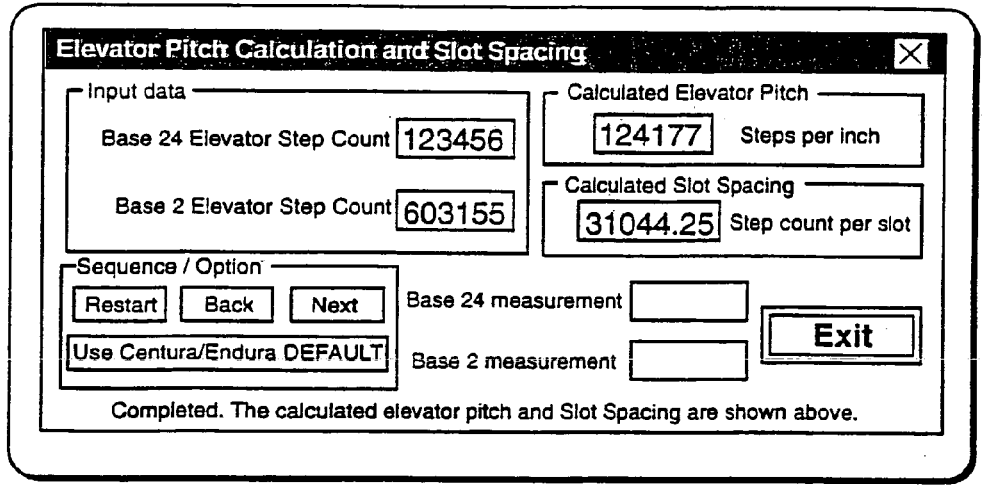
FIG. 18a is a view of the computer display of FIG. 4, depicting an alternative input-output screen used in a leadscrew characterization procedure.

FIG. 18a shows an alternative entry screen 1780 for a graphical user interface for the computer display 416. In this embodiment, the operator inputs the step count values at each of the two measured height positions, such as slot bases 24 and 2, in input boxes 1782 and 1784, respectively. In response, the computer can automatically compute and display the elevator pitch and slot spacing values using the measured heights at the two positions determined as set forth above.

In this manner, the steps per inch pitch and the steps per slot pitch values may be accurately determined for the elevator of the system when used with the wafer cassette being emulated. It is preferred that the operator perform this elevator characterization procedure prior to using the Bottom slot Offset (BSO) and Current Pickup Offset Count calculators on the Leveling page to facilitate accurate setting of these values.

Although the elevator of the illustrated embodiment utilizes a leadscrew mechanism, it is appreciated that the pitch and other characteristics of the elevator movement may be accurately determined for a variety of elevator mechanisms. In addition, utilizing distance sensors having an appropriate range, localized abnormalities may be detected by taking multiple readings at spaced locations along the elevator travel path.

The cassette alignment tool system of the present invention may be used with a variety of workpiece handling systems. For example, in some wafer handling systems the combinations of leadscrews, motors and drive pulleys used are often the same. For these applications, a standard pitch value may be inputted into the cassette alignment tool system in lieu of an elevator characterization procedure. Should there be nonetheless manufacturing variations, the elevator pitch may be accurately determined as set forth above, or may be entered in numerical format.

Once the desired calibration and alignment procedures discussed above have been completed for a particular handling system and the associated robot blade and workpiece, the metrology cassette 410 may be removed from the handler and processing of workpieces may begin using a standard workpiece cassette which was emulated by the metrology cassette 410. However, it is preferred that all handlers of a particular processing system be properly aligned prior to initiating processing of production workpieces.

Metrology Cassette 410 Mechanical Construction and Features

The metrology cassette or fixture 410 of the illustrated embodiment is a precision frame assembly emulating the size and mounting interfaces of a wide range of plastic wafer cassettes. The variable attributes of individual cassettes such as slot positions and spacing can be defined in software instead of requiring physical changes to the metrology cassette 410.

As described above, the laser sensors housed within the metrology cassette 410 use the reference surface 520 of the cassette 410 as a "zero" point. In that the height of the reference surface 520 is known, the true height of the wafer may be easily calculated using the measured offset from the reference height. Since this height typically does not appreciably vary with time or temperature (normal extremes), the lasers can be "soft zeroed" using the offset measured from the reference surface 520.

The laser sensors of the illustrated embodiment have a linear measurement range of 3.149"+/−0.7874" (80,00 mm+/−20,00 mm). Because of the thickness of the base plate 630 (FIG. 5) and the height of the laser head mounting brackets 512 (FIGS. 5 and 6), the linear measurement range of the laser heads covers slots 1–4 and 22–25 for most styles of cassettes. On some systems, the robot blade wrist may interfere with the top and bottom plates, limiting the mechanically usable slot range to 2–4 and 22–24. These ranges as well as other sizes, characteristics and values are provided as examples and can vary, depending upon the type of distance sensor selected and the intended application.

The laser head supports on the mounting brackets 512 may be pin-located and color coded in their positions, and are preferably not mechanically interchangeable so as to prevent setup errors. The laser heads may be located in a variety of patterns including the illustrated triangular pattern (FIG. 6A) which facilitates height measurement operations or an in-line pattern (FIG. 6B) which facilitates blade characterization. The particular pattern selected may vary depending upon the application.

The mechanical framework of the metrology cassette 410 serves a number of functions in addition to enclosing and supporting the laser sensors.

One such function of the fixture is the precise positioning of the reference surface 520 for the laser sensors. It is preferably flat, parallel to the base, and precisely at a defined reference height. In the illustrated embodiment, this reference height of the reference surface 520 is the height marked $D_{NOTINV}$ which is the height of the reference surface above the cassette handler platform base plane 220 when the metrology cassette is in the noninverted position as shown in FIGS. 5 and 9: It is preferred that this dimension be tightly controlled to increase the accuracy of the height measurements. The tolerance specifications for this surface in the illustrated embodiment are as follows:

| | |
|---|---|
| Flatness: | +/−0.002" (+/−0.05 mm) overall |
| Parallelism: | +/−0.002" (+/−0.05 mm) |
| Height $D_{NOTINV}$ (referenced to base plane 220 of platform 200): | $D_{NOTINV}$ +/−0.002" (181.04 mm +/−0.05 mm) |

As set forth above, another preferred construction feature is the thickness of the upper reference plate 612 from its topmost surface in the noninverted orientation to the reference surface 520. This thickness defines another reference height of the reference surface 520. This second reference height is the height marked $D_{iNV}$ which is the height of the reference surface 520 above the cassette handler platform base plane 220 when the metrology cassette is in the inverted position as shown in FIG. 16. Its specification in the illustrated embodiment is:

| | |
|---|---|
| Thickness: | $D_{iNV}$ +/−0.002" (+/−0.05 mm) |

Adding the two reference heights to one another, the overall height of the metrology cassette 410 is:

Total Height: $D_{iNV} + D_{NOTINV}$ +/−0.004" (+/−0,10 mm)

Furthermore, the finish of the reference surface 420 is preferably compatible with the laser sensors. In the illustrated embodiment, the reference surface 520 is lapped, ground and "vapor honed" to a matte finish (0.000016" (0,00041 mm) RMS) to within +/−0.001" (+/−0,0255 mm) flatness across its entire working surface. The reference surface is also hard anodized to deposit a layer which provides a surface which is similar to a white unglazed ceramic.

FIG. 12a shows a top view of the top plate 612 of the metrology cassette. The top plate 612 has base plane surfaces which engage the base plane 220 of the cassette handler platform 200. Those cassette base plane surfaces and other topmost surface features of the top plate are preferably themselves flat within 0.002" (0.05 mm) for the fixture 410 to fit into the system's cassette handler nest in the cassette noninverted position without rocking. These features also may have tight tolerances applied to them so that the assembly will not have excessive lateral movements during its use. The cassette base plane surfaces and other surface features of the bottom plate 630 may be similarly constructed to facilitate fitting into the system's cassette handler nest in the cassette noninverted position.

As best seen in FIGS. 5 and 6, the metrology cassette 410 has side rails 570 which support and locate the reference plate 612. In addition the side rails 570 maintain the "squareness" of the shape of the metrology cassette. A webbing 572 (FIG. 8) in the front (wafer entry side) of the fixture 410 is provided to increase its stability and strength. These pieces also serve as registration surfaces for systems such as the P5000 Ergonomic Cassette Handler (sold by Applied Materials, Inc.) that rely upon certain upper-portion features for location.

In the illustrated embodiment the components of the fixture 410 are preferably located and assembled with dowel pins 580 to ensure that the basic accuracy of the fixture is not compromised under normal operating conditions. The top surface of the plate 612 and the bottom surface of the plate 630 are both machined to imitate the bottom features of common wafer cassettes. Thus, the exterior of the metrology cassettes emulates the bottom surface features, wafer cassette vertical profile, sidebars, "H" bar, etceteras. This allows it to be inserted into most systems with the reference plate on top or bottom. This is very useful when characterizing leadscrews and determining slot spacing. In addition, this widens the applicability of the fixture because it allows upper and lower slot alignments to be performed. It also allows topside and bottom side rotations and extensions to be determined. These features include the H-bar 622 as shown in FIG. 12a. Variations and compromises from the features of individual cassettes can be made so as to accommodate the widest possible range of systems and cassettes. For example, by choosing the smallest size of the registration surfaces within the permitted range of tolerances of the cassettes to be emulated, the number of cassettes which can be emulated by a single tool 410 may be increased.

The metrology cassette 410 of the illustrated embodiment is lightweight, preferably approximating the mass of a production wafer cassette full of wafers. It should be noted that the precise location of the fixture in the horizontal plane (X-Y) is significant primarily in the extension/rotation alignment setups because the plate 612 contains the precision alignment hole 600 for extension and rotation determinations.

The dimensions, ranges, shapes, materials, sizes, characteristics, finishes, processes and values of the metrology cassette construction are provided as examples and can vary, depending upon the intended application.

Calculation of Preferred Height Values

The following provides examples of equations and calculation sequences that can be used internally by the cassette alignment tool system 400 to determine preferred heights such as those measured for the slot base and delta of a slot in the cassette, such as slot #25. In situations where the top slot cannot be mechanically accessed, the dimensions are simply adjusted downward by the slot spacing dimension.

It is very useful to note that the laser sensors of the illustrated embodiment "see" the internal reference surface 520 of the metrology cassette 410 and the backside of a wafer on the blade. Thus, the following equations are, in the illustrated embodiment, not based upon the mechanical centerlines of the blades, or the wafers on the blades.

Also, these calculations are based upon specifications of the wafer cassette being emulated. The values of these specifications may be obtained from the wafer cassette manufacturers and inputted manually into a Cassette Specifications input screen 1900 shown in FIG. 19. The cassette alignment tool system may also be programmed to provide these values automatically in response to the operator inputting the model of the wafer cassette at an input box 1902 of the input screen 1900.

Figure 20:
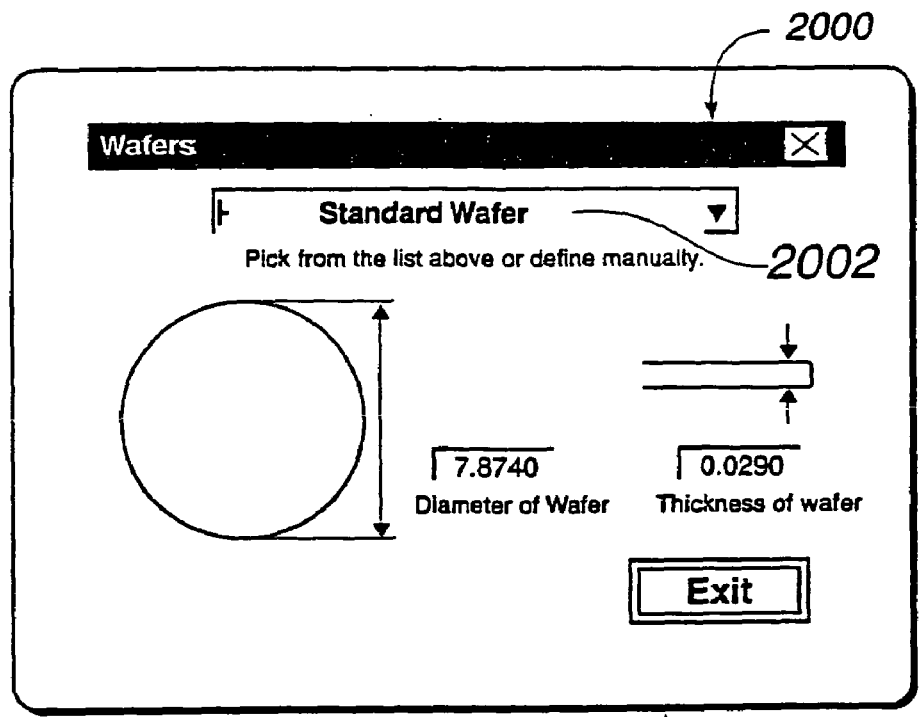
FIG. 20 is a view of the computer display of FIG. 4, depicting an input-output screen used to input wafer dimensions.

Similarly, these calculations are based upon dimensions of the wafers which are to be stored in the wafer cassettes. The values of these specifications, including wafer thickness and diameter, may be inputted manually into a Wafer input screen 2000 shown in FIG. 20. The cassette alignment tool system may also be programmed to provide these values automatically in response to the operator inputting the wafer type at an input box 2002 of the input screen 2000.

Further, these calculations are based upon dimensions of the overall blade thickness and the blade pocket thickness of the robot blade used to carry the wafers into and out of the wafer cassettes. The values of these specifications may be inputted manually into a Tool input screen 2050 shown in FIG. 21. The cassette alignment tool system may also be programmed to provide these values automatically in response to the operator inputting the bade type at an input box 2060 of the input screen 2050.

The following is a calculation of the preferred slot base "N" height, where N=total number of slots and ReferenceDim=the height of the reference (zero) surface 520 from the cassette base surface 220. This is $D_{NOTINV}$ in the illustrated embodiment.

Figure 19:
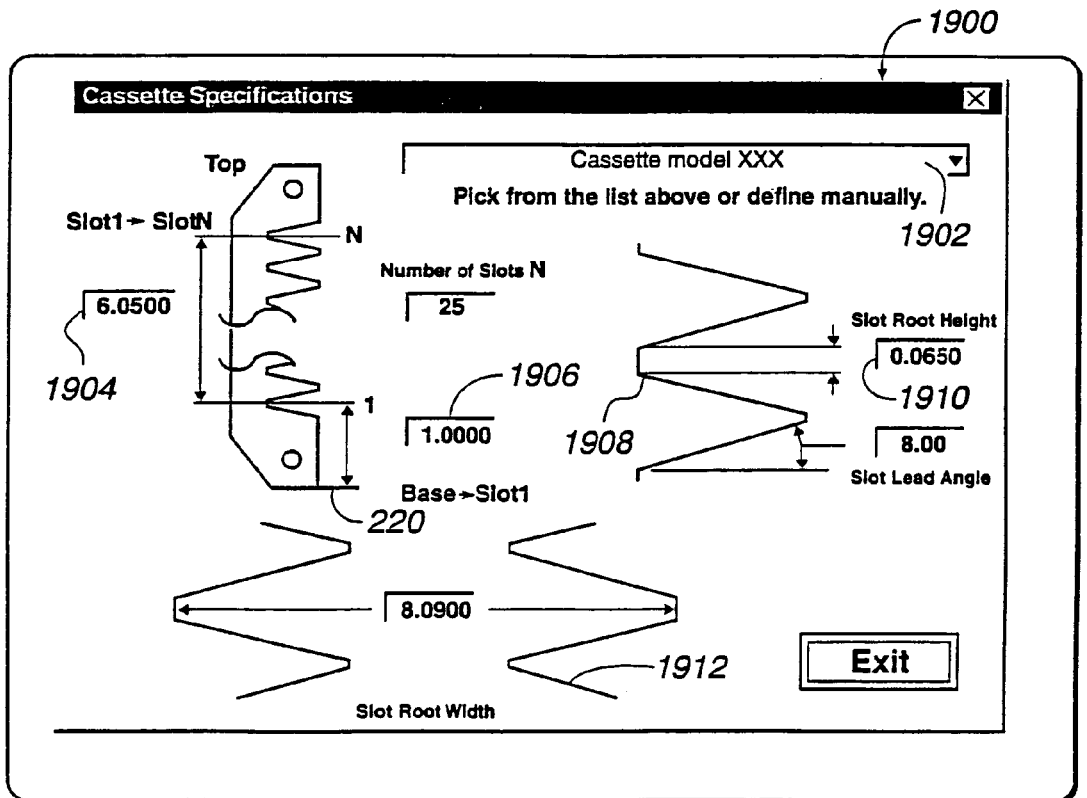
FIG. 19 is a view of the computer display of FIG. 4, depicting an input-output screen used to input wafer cassette specifications.

First, calculate a value for the variable Slot_Spacing, that is, the spacing from the center of one slot to the center of an adjacent slot:

$$\text{Slot\_Spacing} = (\text{Dist\_Slot1-to-Slot}N) \div (N-1)$$

where Dist_Slot1-to-SlotN is the spacing from the center of slot 1 to the center of slot N as shown in the Cassette Specifications input screen 1900 in FIG. 19. The value for Dist_Slot1-to-SlotN may be inputted at 1904 or provided automatically in response to the operator inputting the model of the wafer cassette.

Calculate SlotN_center which is the height of the center of the top slot N:

$$\text{Slot}N\_\text{center} = (\text{Dist\_Slot1-to-Slot}N) + (\text{Dist\_Base-to-Slot1})$$

where Dist_Base-to-Slot1 is the spacing from the platform base plane 220 to the center of slot 1 as shown in FIG. 19. Again, the value for Dist_Base-to-Slot1 may be provided automatically by the system or inputted manually at 1906.

Calculate RootBaseN which is the base height of the root of the top slot as indicated at 1908.

$$\text{RootBase}N = (\text{Slot}N\_\text{center}) - (\text{RootHeight}/2)$$

where the root height (RootHeight) may be inputted at 1910.

Calculate EffectiveToothLength, which is the effective length of a tooth 1912 of the slot. This is the amount of the slot teeth 1912 per side that is outside the diameter of the wafer when it is resting in a slot.

$$\text{EffectiveToothLength} = ((\text{SlotRootWidth}) - (\text{WaferDiameter}))/2$$

Calculate the drop height of a wafer underside below the root of a slot when the wafer is resting upon the lower slot tooth surfaces.

$$\text{WaferDropHeight} = (\sin(\text{SlotToothAngle})) * (\text{EffectiveToothLength})$$

Calculate the height of the underside of a wafer resting in the top slot.

$$\text{Wafer}N\_\text{underside} = (\text{RootBase}N) - (\text{WaferDropHeight})$$

Calculate the height of the underside of a wafer resting in the next slot down from the top slot.

$$\text{Wafer}N-1\_\text{underside} = (\text{Wafer}N\_\text{underside}) - (\text{Slot\_Spacing})$$

Calculate the height of the topside of a wafer resting in the next slot down from the top slot.

$$\text{Wafer}N-1\_\text{topside} = (\text{Wafer}N-1\_\text{underside}) + (\text{WaferThickness})$$

Determine the vertical center height offset of the space between the underside of the topmost wafer and the topside of the next wafer down, both resting in their respective slots.

$$VS\text{Center} = ((\text{Wafer}N\_\text{underside}) + (\text{Wafer}N-1\_\text{topside}))/2$$

Calculate the height that the vertical center offset represents from the base of the metrology cassette 410.

$VS$Height=($VS$Center)+(Wafer$N$–1_topside)

Determine the maximum effective blade thickness. This is the larger value of either the blade thickness (if the wafer is fully received within the blade pocket and does not extend above the blade top surface) or the sum of the blade pocket thickness plus the wafer thickness (the wafer extends above the blade top surface).

Which ever one is larger:

$WB$Thickness=(BladeThickness)

or:

$WB$Thickness+((BladePocket)+(WaferThickness))

Calculate the mechanical center (vertical) of the effective blade (see above).

$WB$Center=($WB$Thickness)/2

Determine the height of the lowest edge of the effective blade thickness when the blade is centered in the available space.

$WB$_underside=(($VS$Height)–($WB$Center))

Determine the underside height of a wafer placed on the blade while centered in the available space between the two wafers.

Wafer_underside=(($WB$_underside)+(BladePocket))

Calculate the measurement that the laser sensors would "see" under these ideal conditions expressed as an offset distance to the reference surface 520. This is the preferred slot base measurement for the topmost slot.

Wafer$N$_SlotBase=((ReferenceDim)–Wafer_Underside))

Calculation of the preferred slot delta "N" height:
Calculate the slot spacing.

Slot_Spacing=(Dist_Slot1-to-Slot$N$)÷($N$–1)

Calculate the center of the top slot.

Slot$N$_center=(Dist_Slot1-to-Slot$N$)+(Dist_Base-to-Slot1)

Determine the underside height of a wafer placed on the blade while centered in the topmost slot.

Wafer_underside=((Slot$N$_center)–((WaferThickness)/2))

Calculate the measurement that the laser sensors would "see" under these ideal conditions expressed as an offset to the reference surface 520. This is the preferred slot delta measurement for the topmost slot.

Wafer$N$_SlotDelta=((ReferenceDim)–(Wafer_Underside))

In accordance with another aspect of the present embodiments, an additional consideration when calculating preferred heights of wafers resting in actual cassette slots is the curvature of the workpiece edge 2300 (FIG. 23) of a wafer 230b. This curvature serves to reduce operator injury and to reduce stress cracking of the workpiece by relieving stresses.

Figure 23:
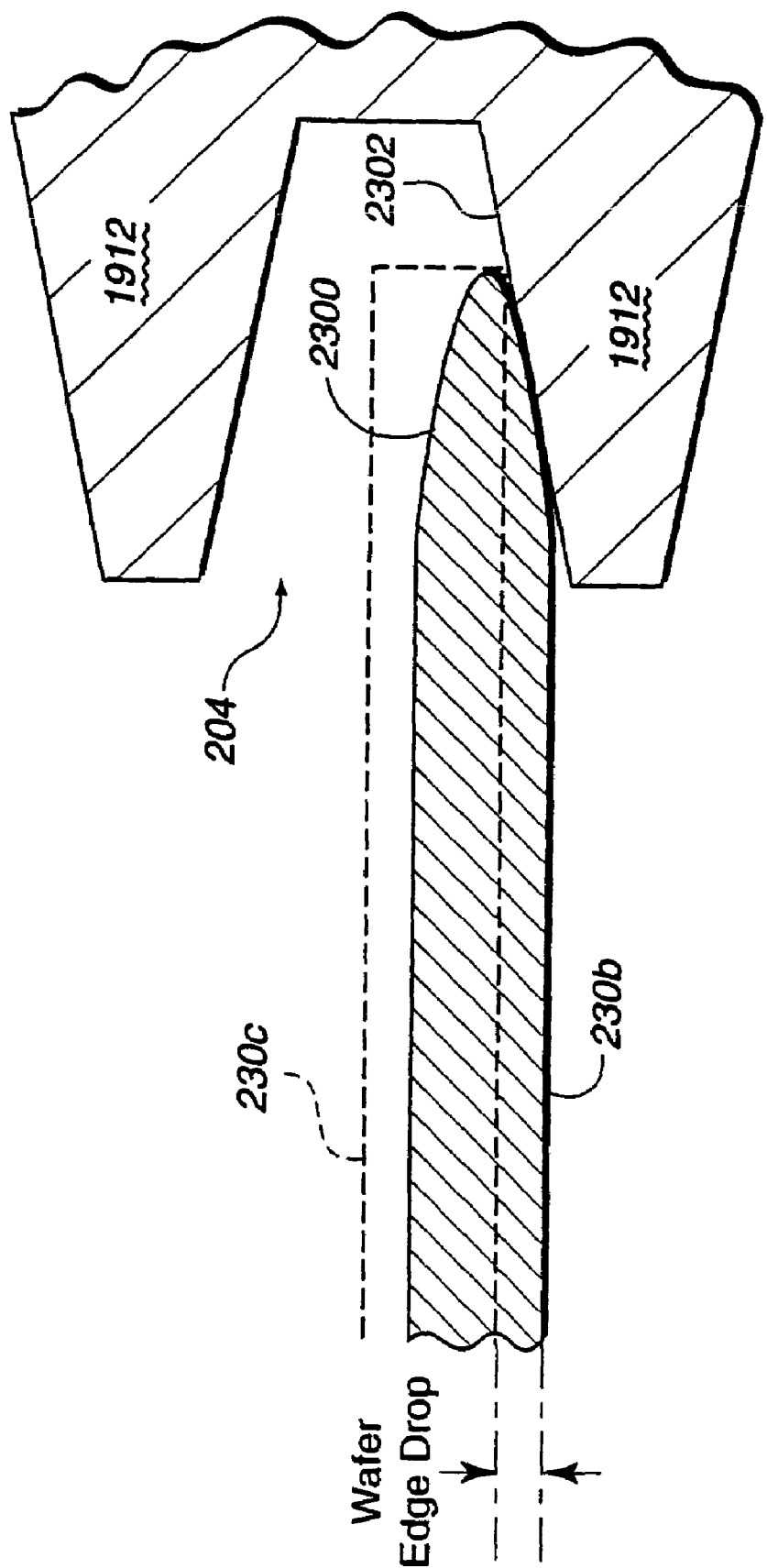
FIG. 23 is an enlarged schematic diagram illustrating the effect of wafer edge curvature on the position of a wafer supported in a cassette.

As shown in FIG. 23, the effect of the edge curvature 2300 is to physically lower a workpiece such as the workpiece 230b for example, as compared to a workpiece 230c (shown in phantom) having a flat edge, relative to the platform reference surface 220 (FIG. 5) of the handler platform 200. The amount that the curvature causes the workpiece to drop within the slot may be calculated as a function of the curvature of workpiece edge and the shape of the slot of the cassette. The curvature 2300 may follow a well-defined industry standard (such as SEMI M1-0298) or may have a proprietary curvature. In the illustrated embodiment, the height differential WaferEdgeDrop by which the workpiece is lowered may be calculated by using the following formula which is of sufficient accuracy for many applications having customary values of the slot tooth angle and wafer curvature:

WaferEdgeDrop=(sin $h$(SlotToothAngle)*$W_{THICK}$)

(where sin h represents the hyperbolic sine of the referenced angle and $W_{THICK}$ is the thickness of the wafer).

The resulting WaferEdgeDrop distance may be used to adjust the predicted height of wafers resting in cassette wafer slots downward. It should be appreciated that other wafer edge profiles can also be mathematically simulated and that they may also be used to predict the amount of vertical displacement of a wafer workpiece in a cassette slot.

Figure 24A:
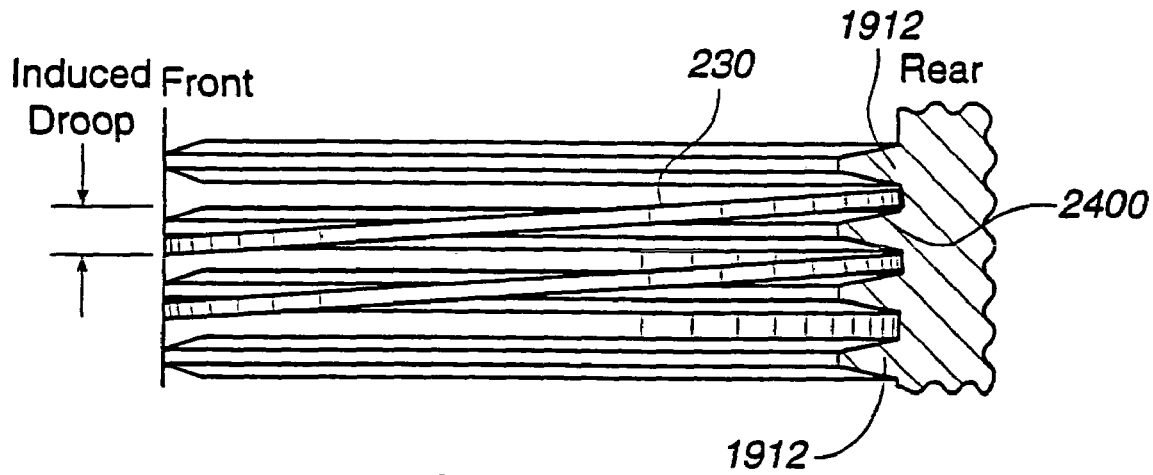
FIG. 24a is an enlarged schematic side cross-sectional view illustrating the effect of wafer edge support on the position of a wafer supported in a cassette.
Figure 24B:
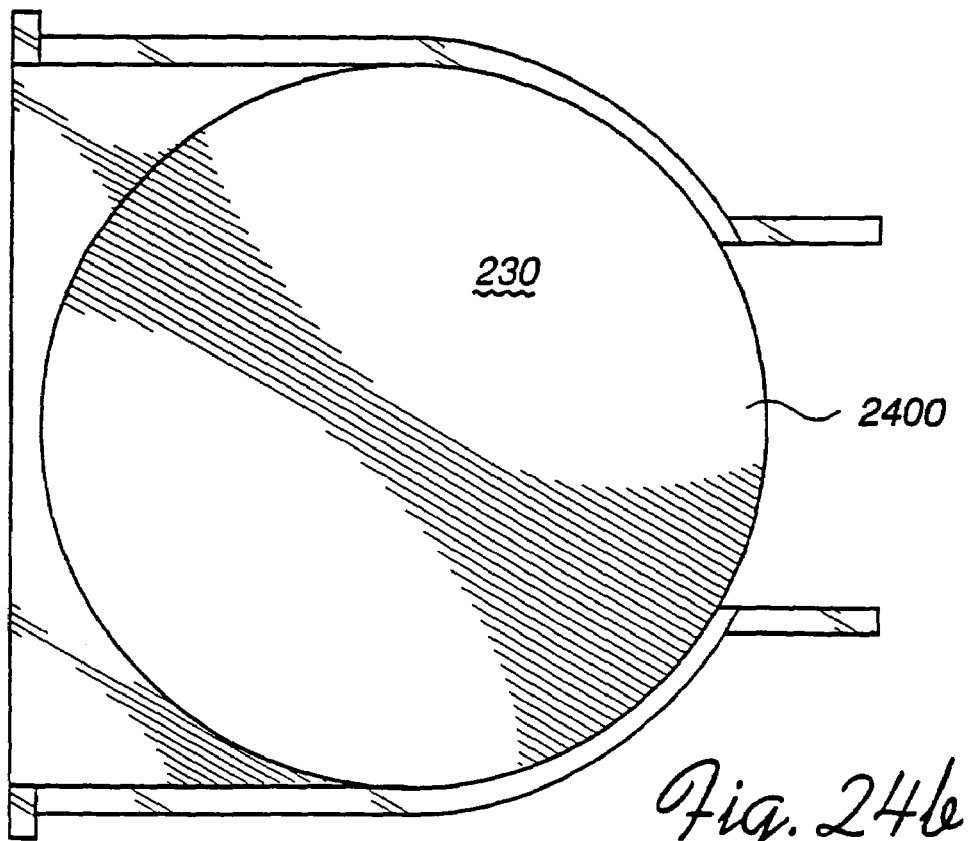
FIG. 24b is an enlarged schematic top view illustrating the effect of wafer edge support on the position of a wafer supported in a cassette.

Yet another calculation is the amount of front-to-rear vertical displacement that may result from the wafer workpiece 230 being seated completely inward within cassette wafer slots 204 as shown in FIGS. 24a and 24b. This front-to-rear vertical displacement is typically caused by the wafer being supported at an angle by the sloped surface of a slot tooth 1912 primarily at the inward (rearmost) edge 2400 of the wafer. As a result, the wafer 230 is pivoted about an axis formed by a chord across the workpiece defined by the left and right side edges, and perpendicular in the horizontal plane to the normal insertion and withdrawal motion for the workpiece relative to the cassette.

The effect of this displacement is to reduce the available vertical motion space that is available for the robot blade 206 by an amount equal to the total of the displacement and which is divided equally on the top and bottom of the otherwise calculated vertical motion space.

The displacement InducedDroop may be calculated using the following formula:

InducedDroop=(WaferDropHeight*2)

Like the wafer edge drop calculation, the calculated induced droop distance may be used to adjust the predicted height of wafers resting in cassette wafer slots downward.

It will be recognized of course that other preferred heights may be calculated or otherwise determined to provide a basis for comparison to measured height values.

Interface controller 412 Construction and Features

The interface controller 412 of the illustrated embodiment serves multiple functions in the cassette alignment tool system 400 set. Among other things, it acts as a power conditioning and distribution center, a signal conditioner and converter, display, communications driver, and operator interface. Thus, the computer generated graphical interface may be eliminated in some applications.

Figure 22:
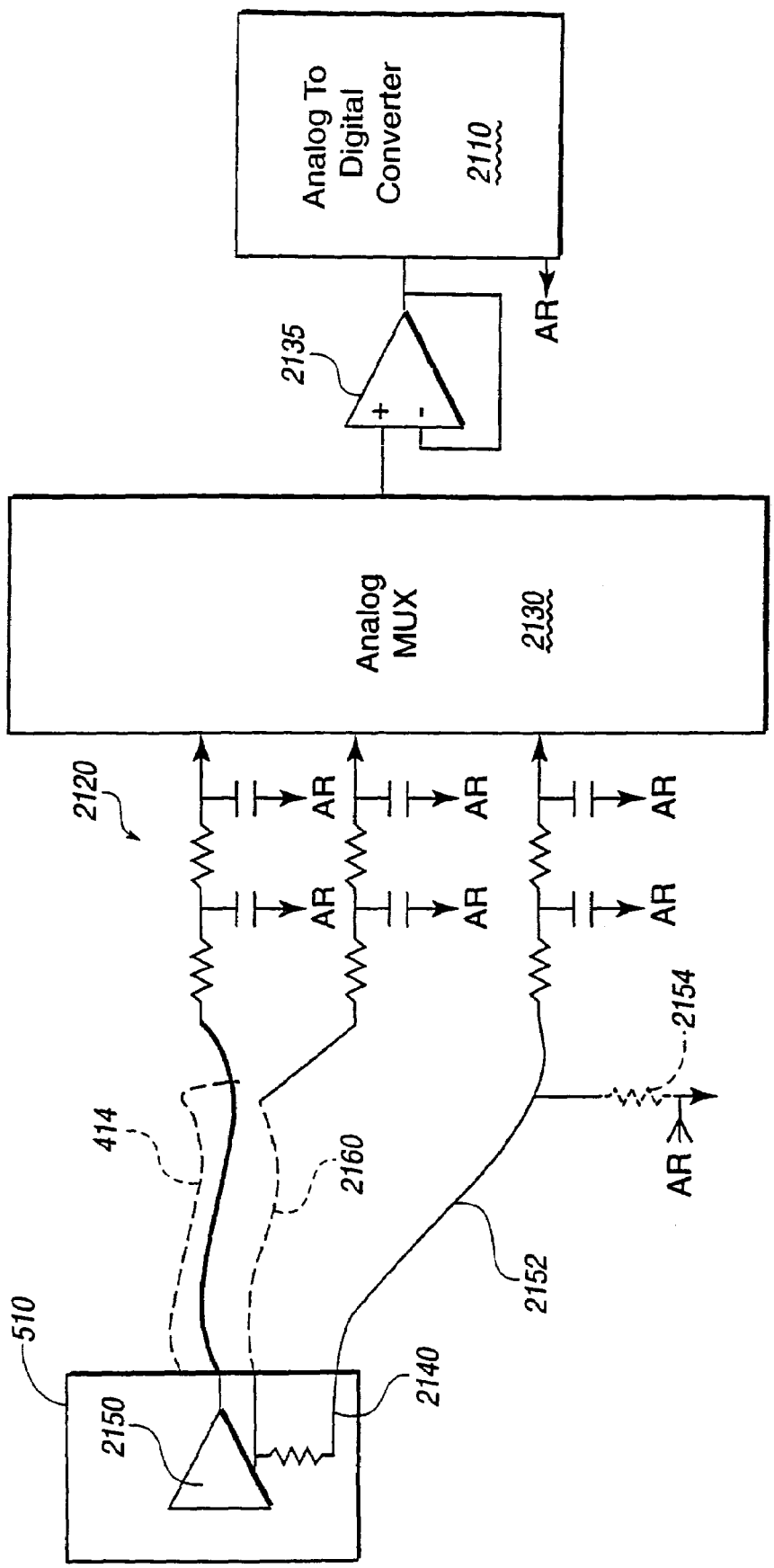
FIG. 22 is a schematic diagram of the interface controller signal processing circuit for sampling signals from the laser head sensors.

Outputs from the laser sensors range from −5.0000 to +5.0000 volts. This voltage range corresponds to the limits of the linear measurement range, as previously mentioned. An internal high-precision analog-to-digital converter 2110 (FIG. 22) is used to change the incoming voltage level into a signed binary number which is then converted to Inch or Metric readings for display or transmission. The display conversion range in the illustrated embodiment is −1.5745" (−40,00 mm) to +1.5745" (+40,00 mm), which represents an input voltage range of −10.0000 to +10.0000 volts. Because the sensors of the illustrated embodiment output half this voltage range, representing half this distance, the usable display range is −0.7875″ (−20,00 mm) to +0.7875″ (+20,00 mm).

Due to the highly sensitive nature of the sensors preferably used in this tool, their outputs can be relatively noisy, having electrical glitches and "shot" noise superimposed on their output signals. This is preferably carefully filtered out by a filter circuit 2120 which couples the signal line of the cable 414 from the laser sensors to an analog input multiplexer 2130. An isolation amplifier 2135 isolates the multiplexer output from the converter input. In addition, the outputs of the laser heads are referenced to an analog ground point AR which is coupled to ground point 2140 inside the sensors' amplifiers 2150 by a power return line 2152 which has an effective line wiring resistance as represented by resistance 2154. For this reason, the outputs also carry a common mode voltage offset voltage component in addition to everything else.

As shown in the filter circuit 2120, the cassette alignment tool system 400 interface controller 412 is specially designed to filter the incoming signals relative to their internal ground points including the cable shielding 2160, while also filtering the ground point voltages. These are sensed and digitized separately and compared to determine the true signal voltage outputs from the sensors.

Despite all the analog filtering, local environment RFI (radio frequency interference), low frequency AC fields, and magnetic fields can still affect readings. To reduce or eliminate the effects of these environmental factors, the sensors are preferably sampled many times and the results are averaged to obtain the readings that are finally displayed. An options switch on the bottom of the PC board in the interface controller 412 can control how many readings are averaged.

Once filtered, converted, sampled, averaged, the readings are displayed on the local LCD screen 530 and are also broadcast on the serial port to the computer 416.

Information transmitted on the serial port is updated once per second typically. In addition, the driver software for the serial port emits a synchronization signal and senses for a similar signal from a remote connection. The transmitted signal is used to indicate to the cassette alignment tool system 400 that an interface controller 412 is connected and active. When a similar signal is received from the cassette alignment tool system 400 (or other host), the interface controller 412 switches from local to remote mode. In this mode, the LCD display is not updated periodically. Instead, it serves as a data terminal display for the cassette alignment tool system 400, allowing messages to be sent and shown.

Other than during the warmup period, the front panel buttons are preferably continuously scanned. Activation of any of these buttons causes a message to be sent over the serial port. The inch/metric switch condition is preferably not transmitted to the computer 416 of the cassette alignment tool system 400, as it contains its own option selector for this condition.

The interface controller 412 is a metal clamshell structure with the majority of the electronics attached to its front face cover. The laser sensor amplifiers are mounted to its base. Multicolor silkscreening and grouped connectors help to prevent connection errors. The extender cords for the laser measurement heads are also color coded. The interface controller 412 accommodates five laser sensors, although three are shown installed in the illustrated embodiment. More or fewer sensors may be provided depending upon the applications. These sensors are color coded and correspond directly to the red, blue and yellow color-coded laser sensor heads on the metrology cassette 410.

A 4 line by 40 character high contrast LCD display with back light is provided. Indicator LEDs for the slide switch-selectable English/Metric mode display and for prompting the operator during procedures are available on the front face. An RS-232 serial port enables connection and communication to the cassette alignment tool system computer 416. This connection provides ASCII (human readable) data in a 9600,N,8,1 format. Connections to standard DB-9M PC COM ports (IBM-AT standard) are accomplished using a 9 wire male-female pass through cable. A null modem adapter or cable is preferably not to be used for normal connection to standard PC ports. Front panel pushbuttons include Zero, Back, Select, and Next functions. When communications are established with a host computer and the cassette alignment tool system 400, the functions of these buttons are echoed in the cassette alignment tool system 400. The corded "universal" switching power supply accepts 90–265 VAC inputs from 45–75 hertz. The power supply accepts world standard IEC320 style line cords which allow the operator to plug in whatever local style is appropriate. Alternatively the interface controller 412 will accept "clean" 24+/−4 VDC from any convenient power source. The center pin of the rear-panel-mounted power jack is positive. The power input is reverse polarity protected and fused. The power to the laser heads is preferably not provided to all of the heads at one time at start up. Instead, it is preferred that the heads be switched on in sequence, one at a time to facilitate proper operation.

A single 16-bit analog-to-digital converter is utilized for conversions from the laser head outputs to numeric information: This promotes uniformity and stability. The laser head signal inputs are heavily electrically filtered to enhance rejection of electrical and RF noise, as well as to reduce the effects of "shot noise" in their signals. The analog multiplexing circuitry is buffered to minimize variations from channel-to-channel. Multiplexer-induced variations are typically less than 0.002% of the final readings, therefore they are negligible. Samples of the laser head outputs are taken 160 times per second, but 128 or 256 readings are averaged to obtain each update value. This provides improved immunity to false readings caused by AC line pickup and line noise. The signals are taken from the laser heads in "Kelvin" style. That is to say that the ground reference is taken from a separate connection that is referenced internally to the laser heads. The true signals are differential voltages from this reference point. This technique reduces or eliminates "ground loop" (common mode) voltage effects. The options switch on the printed circuit board allows the operator to select the displayed resolution for English (inch) measurements. If set to "off", inch measurements are shown on the box's display as four decimal place numbers. If "on" they are displayed as three decimal place numbers. The switch setting has no effect upon metric (mm) displays, but has one other effect. When "off", 256 measurement samples are averaged to obtain each display update. When "on", 128 measurement samples are averaged. This affects the display update and reporting speed, but provides significantly greater stability for four decimal place displays.

The dimensions, ranges, shapes, materials, sizes, characteristics, finishes, processes and values of the interface controller construction and circuitry are provided as examples and can vary, depending upon the intended application.

It will, of course, be understood that modifications of the illustrated embodiments, in its various aspects, will be apparent to those skilled in the art, some being apparent only after study others being matters of routine mechanical and electronic design. Other embodiments are also possible, their specific designs depending upon the particular application. For example, a variety of methods and devices for physical measurements may be utilized in addition to those described above. Such methods and devices may include, for example, inductive and capacitive proximity sensors, non-laser optical sensors, sonic distance sensors and others. A variety of workpiece cassette shapes and sizes may also be utilized. Furthermore, a variety of graphical displays visually depicting alignments and misalignments and the degrees of such may be used in addition to or instead of numerical displays. As such, the scope of the invention should not be limited by the particular embodiments described herein but should be defined by the appended claims and equivalents thereof.

What is claimed is:

1. An alignment tool for aligning a cassette handler to a robot blade in a workpiece handling system wherein said cassette handler has a support surface for supporting a workpiece cassette having a plurality of slots for carrying workpieces, comprising:
    a frame adapted to be supported by said cassette handler support surface in a first orientation of said frame relative to said handler support surface, said frame having a reference surface and a first support surface positioned to engage said handler support surface and to support said reference surface a first predetermined distance from said handler support surface in said first orientation of said frame relative to said handler support surface; and
    a first distance sensor positioned to measure the distance of said reference surface from said sensor and to measure the distance of a workpiece from said sensor wherein said frame is adapted to be supported by said cassette handler support surface in a second orientation of said frame relative to said handler support surface, said frame having a second support surface positioned to engage said handler support surface and to support said reference surface a second predetermined distance from said handler support surface in said second orientation of said frame relative to said handler support surface.

2. The alignment tool of claim 1 wherein said workpiece cassette has registration surfaces and said cassette handler has registration surfaces adapted to mate with said cassette registration surfaces to register said cassette to said handler, said frame having first registration surfaces adapted to mate with said handler registration surfaces and to register said frame to said handler in said first orientation of said frame.

3. The alignment tool of claim 1 wherein said frame has second registration surfaces adapted to mate with said handler registration surfaces and to register said frame to said handler in said second orientation of said frame.

4. The alignment tool of claim 1 wherein said distance sensor is carried within said frame.

5. The alignment tool of claim 1 wherein said distance sensor includes a laser head.

6. The alignment tool of claim 1 wherein said first distance sensor is positioned to measure the distance of a first location of said reference surface from said sensor and to measure the distance of a first location of said workpiece from said sensor, said tool further comprising a second distance sensor positioned to measure the distance of a second location of said reference surface from said second sensor and to measure the distance of a second location of said workpiece from said second sensor.

7. The alignment tool of claim 6 wherein said cassette handler has a mechanism for adjusting the orientation of said handler support surface along a first direction, wherein said first and second sensors are disposed along a line parallel to said first direction.

8. The alignment tool of claim 7 further comprising a third distance sensor positioned to measure the distance of a third location of said reference surface from said third sensor and to measure the distance of a third location of said workpiece from said third sensor.

9. An alignment tool for aligning a cassette handler to a robot blade in a workpiece handling system wherein said cassette handler has a support surface for supporting a workpiece cassette having a plurality of slots for carrying workpieces, comprising:
    a frame adapted to be supported by said cassette handler support surface in a first orientation of said frame relative to said handler support surface, said frame having a reference surface and a first support surface positioned to engage said handler support surface and to support said reference surface a first predetermined distance from said handler support surface in said first orientation of said frame relative to said handler support surface;
    a first distance sensor positioned to measure the distance of said reference surface from said sensor and to measure the distance of a workpiece from said sensor, wherein said first distance sensor is positioned to measure the distance of a first location of said reference surface from said sensor and to measure the distance of a first location of said workpiece from said sensor;
    a second distance sensor positioned to measure the distance of a second location of said reference surface from said second sensor and to measure the distance of a second location of said workpiece from said second sensor, wherein said cassette handler has a mechanism for adjusting the orientation of said handler support surface along a first direction, wherein said first and second sensors are disposed along a line parallel to said first direction; and
    a third distance sensor positioned to measure the distance of a third location of said reference surface from said third sensor and to measure the distance of a third location of said workpiece from said third sensor wherein said cassette handler has a mechanism for adjusting the orientation of said handler support surface along a second direction, wherein said second and third sensors are disposed along a line parallel to said second direction.

10. An alignment tool for aligning a cassette handler to a robot blade carrying a target in a workpiece handling system wherein said cassette handler has a support surface for supporting a workpiece cassette having a plurality of slots for carrying workpieces, comprising:
    a frame emulating a workpiece cassette adapted to be supported by said cassette handler support surface in a first orientation of said frame relative to said handler support surface, said frame having a reference surface and a first support surface positioned to engage said handler support surface and to support said reference surface a first predetermined distance from said handler support surface in said first orientation of said frame relative to said handler support surface; and
    a first distance sensor positioned to measure the distance of said reference surface from said sensor and to measure the distance of at least a portion of a target from said sensor wherein said measurements are used to align the cassette handler to the robot blade;

wherein said frame is adapted to be supported by said cassette handler support surface in a second orientation of said frame relative to said handler support surface, said frame having a second support surface positioned to engage said handler support surface and to support said reference surface a second predetermined distance from said handler support surface in said second orientation of said frame relative to said handler support surface.

11. The alignment tool of claim 10 wherein said workpiece cassette has registration surfaces and said cassette handler has registration surfaces adapted to mate with said cassette registration surfaces to register said cassette to said handler, said frame having first registration surfaces adapted to mate with said handler registration surfaces and to register said frame to said handler in said first orientation of said frame.

12. The alignment tool of claim 11 wherein said frame has second registration surfaces adapted to mate with said handler registration surfaces and to register said frame to said handler in said second orientation of said frame.

13. The alignment tool of claim 11 wherein said distance sensor is carried within said frame.

14. The alignment tool of claim 11 wherein said distance sensor includes a laser head.

15. The alignment tool of claim 11 wherein said first distance sensor is positioned to measure the distance of a first location of said reference surface from said sensor and to measure the distance of a first location of said target from said sensor, said tool further comprising a second distance sensor positioned to measure the distance of a second location of said reference surface from said second sensor and to measure the distance of a second location of said target from said second sensor.

16. The alignment tool of claim 15 wherein said cassette handler has a mechanism for adjusting the orientation of said handler support surface along a first direction, wherein said first and second sensors are disposed along a line parallel to said first direction.

17. The alignment tool of claim 16 further comprising a third distance sensor positioned to measure the distance of a third location of said reference surface from said third sensor and to measure the distance of a third location of said target from said third sensor.

18. An alignment tool for aligning a cassette handler to a robot blade carrying a target in a workpiece handling system wherein said cassette handler has a support surface for supporting a workpiece cassette having a plurality of slots for carrying workpieces, comprising:

a frame emulating a workpiece cassette adapted to be supported by said cassette handler support surface in a first orientation of said frame relative to said handler support surface, said frame having a reference surface and a first support surface positioned to engage said handler support surface and to support said reference surface a first predetermined distance from said handler support surface in said first orientation of said frame relative to said handler support surface;

a first distance sensor positioned to measure the distance of said reference surface from said sensor and to measure the distance of at least a portion of a target from said sensor wherein said measurements are used to align the cassette handler to the robot blade and wherein said first distance sensor is positioned to measure the distance of a first location of said reference surface from said sensor and to measure the distance of a first location of said target from said sensor, a second distance sensor positioned to measure the distance of a second location of said reference surface from said second sensor and to measure the distance of a second location of said target from said second sensor wherein said cassette handler has a mechanism for adjusting the orientation of said handler support surface along a first direction, wherein said first and second sensors are disposed along a line parallel to said first direction; and a third distance sensor positioned to measure the distance of a third location of said reference surface from said third sensor and to measure the distance of a third location of said target from said third sensor wherein said cassette handler has a mechanism for adjusting the orientation of said handler support surface along a second direction, wherein said second and third sensors are disposed along a line parallel to said second direction.

* * * * *